(12) United States Patent
Zhou

(10) Patent No.: US 9,362,916 B2
(45) Date of Patent: Jun. 7, 2016

(54) CIRCUIT ARRANGEMENTS AND METHODS OF OPERATING THE SAME

(71) Applicant: Agency for Science, Technology and Research, Singapore (SG)

(72) Inventor: Jun Zhou, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/706,627

(22) Filed: May 7, 2015

(65) Prior Publication Data

US 2015/0244369 A1    Aug. 27, 2015

Related U.S. Application Data

(62) Division of application No. 13/905,468, filed on May 30, 2013, now Pat. No. 9,054,694.

(30) Foreign Application Priority Data

May 31, 2012    (SG) .................. 201204010-1

(51) Int. Cl.
*H03K 19/0175*    (2006.01)
(52) U.S. Cl.
CPC .................. *H03K 19/017509* (2013.01)
(58) Field of Classification Search
CPC .............. H03K 19/018521; H03K 19/018528; H03K 19/00315
USPC ............. 326/63, 68, 80–83, 86–87, 112, 115; 327/108–109, 112, 333
See application file for complete search history.

(56) References Cited

U.S. PATENT DOCUMENTS

| | | | | |
|---|---|---|---|---|
| 6,480,050 B1* | 11/2002 | Barnes | ........... | H03K 19/018521 326/112 |
| 7,205,819 B2* | 4/2007 | Davis | ............... | H03K 19/00323 326/63 |
| 9,054,694 B2* | 6/2015 | Zhou | | |
| 2005/0068070 A1* | 3/2005 | Diffenderfer | .. | H03K 19/018521 327/112 |
| 2006/0033530 A1* | 2/2006 | Seo | .................... | H03K 19/0016 326/81 |
| 2006/0061386 A1* | 3/2006 | Kanzaki | ......... | H03K 19/018521 326/81 |
| 2006/0071686 A1* | 4/2006 | Chang | ............ | H03K 19/018528 326/68 |
| 2006/0226873 A1* | 10/2006 | De Sandre | ....... | H03K 19/01707 326/81 |

* cited by examiner

*Primary Examiner* — Jason M Crawford
(74) *Attorney, Agent, or Firm* — K. David Crockett, Esq.; Niky Economy Syrengelas, Esq.; Crockett & Crockett, PC

(57) ABSTRACT

In various embodiments, a circuit arrangement may be provided. The circuit arrangement may include a level shifting stage configured to be coupled to a first reference voltage, the level shifting stage having an output node. The circuit arrangement may further include a first input electrode in electrical connection with the level shifting stage. The circuit arrangement may also include a second input electrode in electrical connection with the level shifting stage. The circuit arrangement may further include a load having a first end and a second end, the first end coupled to the level shifting stage and the second end for coupling to a second reference voltage. In addition, the circuit arrangement may include a bypass circuit element connected in parallel to the load. The bypass circuit element may be configured to allow current to flow through upon application of an external voltage for bypassing the load.

18 Claims, 18 Drawing Sheets

PRIOR ART

FIG. 6       PRIOR ART

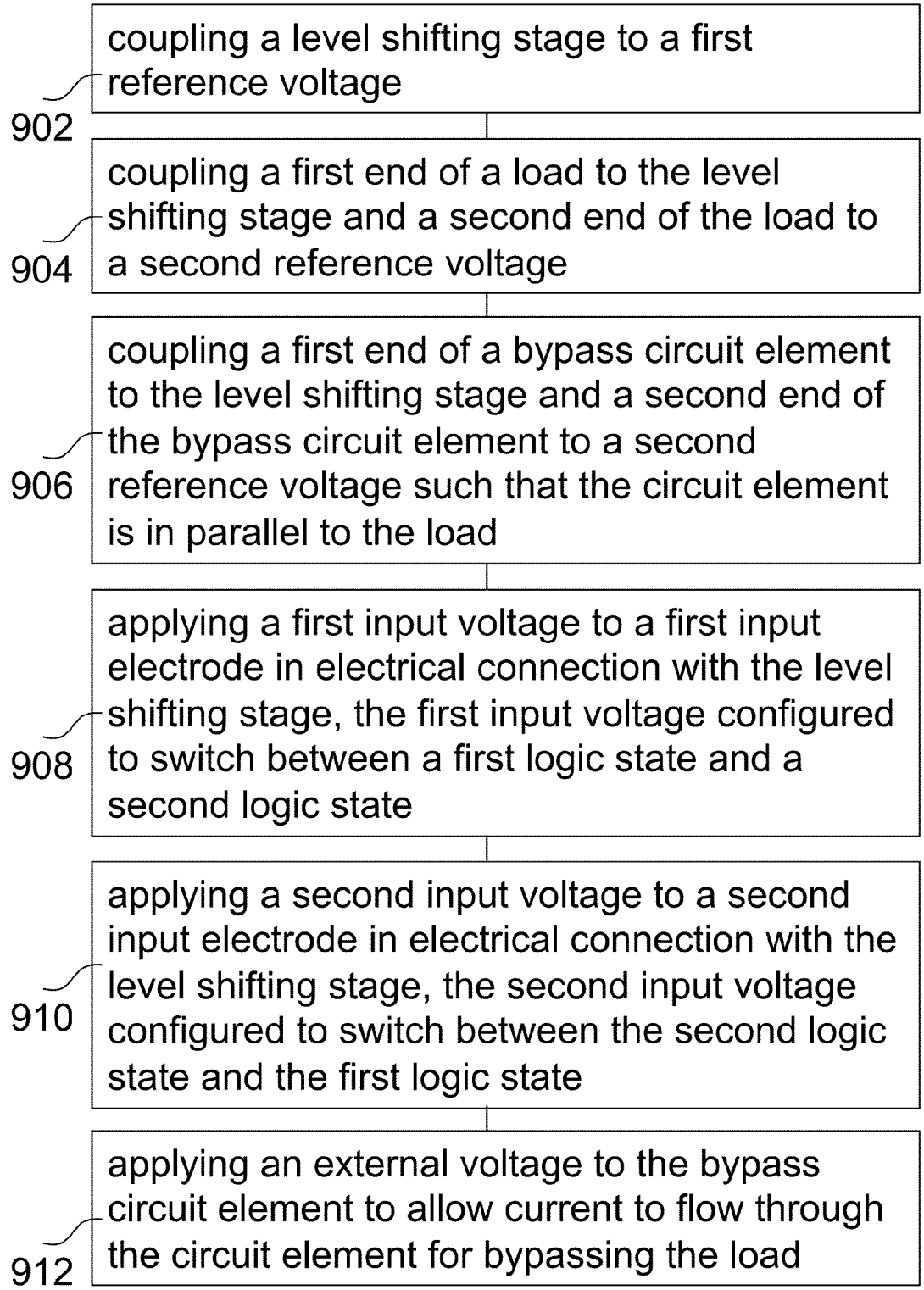

CIRCUIT ARRANGEMENTS AND METHODS OF OPERATING THE SAME

CROSS-REFERENCE TO RELATED APPLICATIONS

This application is a divisional of U.S. application Ser. No. 13/905,468, filed May 30, 2013, which claims priority to SG application No. 201204010-1 filed May 31, 2012.

TECHNICAL FIELD

Various aspects of this disclosure relate to circuit arrangements and methods of operating the same.

BACKGROUND

Voltage scaling has been used to reduce the power consumption of digital and analog circuits. It has been found that minimal energy may be achieved when the supply voltage is lowered below threshold voltage and the leakage energy balances the active energy.

However, aggressive reduction of the supply voltage may significantly degrade the performance as well as increase variations of circuits. Compared to deep sub-threshold operation, around-threshold or near-threshold operation has been considered to be more practical as energy reduction may be achieved at the same time with substantially improved performance as well as reduction in variation.

Future low power systems on chips (SOCs) are likely to include many components operating at around-threshold or near-threshold voltages to super-threshold voltages. This requires level shifters that are able to perform fast and energy efficient level shifting for a wide range of supply voltages from around-threshold or near-threshold voltages to super-threshold regions.

FIGS. 1A and 1B show schematics of two level shifters for super-threshold operations. FIG. 1A shows a schematic 100*a* of a level shifter based on the cross-coupled p-channel metal oxide field effect semiconductor (PMOS) transistors configuration. The level shifters include two n-channel metal oxide field effect semiconductor (NMOS) transistors 102, 104 and two p-channel metal oxide field effect semiconductor (PMOS) transistors 106, 108. The gate electrodes of the PMOS transistors 106, 108 are coupled to the drain electrode of the NMOS transistors 104, 102 respectively. An input voltage $V_{low,in}$ may be applied to node 110. Node 110 is coupled to the gate electrode of transistor 102. An input inverter 112 (power by voltage $V_{low}$) is used to convert the input voltage to generate an inverted input voltage at the gate electrode of transistor 104. The drain electrodes of transistors 106, 108 are coupled to supply voltage $V_{DD}$. An output inverter 114 may be used to electrically connect the drain electrode of transistor 102 to output node 116. When the voltage $V_{low,in}$ is applied to node 110, an output voltage about $V_{DD}$ may be generated at output node 116. Conversely, when a voltage of about 0 V is applied to node 110, an output voltage about 0V may be generated at output node 116.

This structure works well for input voltages well above threshold voltages. When the input voltage decreases to threshold levels, transistors 102 or 104 are nearly turned off. The pull down current is unable to overcome the pull up current and the level shifter may fail to flip. An intuitive solution is to increase the sizes of transistors 102 and 104. However, this is impractical because when the input voltages applied to transistors 102 or 104, transistors 102 and/or 104 conduct mainly sub-threshold currents which are several times smaller than the super-threshold currents flowing through transistors 106 and/or 108. For example, simulation shows that at 90 nm, transistors 102 and 104 have to be sized 2000 times larger than transistors 106 and 108 for the circuit to operate in the around-threshold region.

FIG. 1B shows a schematic 100*b* of a level shifter based on the current mirror configuration. The level shifter uses current-mirror to achieve level shifting. NMOS transistors 122, 124 and PMOS transistors 126, 128 are connected to form a current mirror. An input voltage may be applied at node 130. An input inverter 132 is used to generate an inverted input voltage from the input voltage. An output node 136 may be connected to the drain of transistor 124 to generate an output voltage. When the input voltage is high, there is current flowing through transistors 102, 106. An amplified current flows through transistors 104, 108 and charge the output node 136 to high (e.g. close to supply voltage VDD). When the input voltage is low, the current mirror is disabled and the output is discharged to low (e.g. close to ground). While the level shifter based on the current mirror configuration can operate at a lower supply voltage, there is a constant static current flowing through transistors 102, 106 when the output voltage is high, which results in a large standby leakage power consumption.

FIG. 2 shows a schematic 200 of a level shifter. The level shifter includes NMOS transistors 202, 204, 206, 208, 210, 212 and 214, PMOS transistors 216, 218, 220, 222, 224, 226, 228, 230, 232, 234 as well as inverted 238, 240. The level shifter includes a reduced swing inverter (RSI) 240 (including transistors 212, 214, 230, 232, 234) to achieve the pull-up path to achieve fast transition without heavily upsizing the pull down transistors. However, this structure uses more than 20 transistors which increase its area overhead and sensitiveness to process variation. Another drawback is that the propagation delay does not scale with voltage very well since the pull-up transistors are constantly weakened.

FIG. 3 shows a schematic 300 of a level shifter. The level shifter includes a first stage having NMOS transistors 302, 304 and PMOS transistors 306, 308. A diode connected PMOS transistor 310 acting as a load us used to weaken the pull-up path. The level shifter further includes a second stage cascaded with the first stage to achieve full swing of voltage. The second stage includes NMOS transistors 312, 314 and PMOS transistors 316, 318. The propagation of this level shifter does not scale very well with voltage especially when the supply voltage is raised above the threshold voltage since the drop across PMOS transistor 310 is nearly constant. As such, this level shifter may not be suitable for applications which require dynamic voltage scaling (DVS). Also, the level shifter may suffer from asymmetric rise and fall delay caused by the input inverter 320, especially at ultra low voltages due to the reduced conductance of the cross-coupled PMOS. During a fall transition (1→0), transistor 302 is switched off before transistor 304 is switched on due to the delay caused by the input inverter 320. The current flowing through transistors 302, 306 are close to zero. This causes reduced transconductance for switching and increases the fall delay. During a rise transition (0→1), the transistor 304 is switched off after the transistor 302 is switched on. The overlapped on-time leads to high conductance and small rise delay.

FIG. 4 shows a schematic 400 of a level shifter. The level shifter includes NMOS transistors 402, 404, 406, 408, PMOS transistors 410, 412, 414, 416, 418 as well as inverters 420, 422. The level shifter achieves fast level shifting by creating non-conflicting rise and fall transitions with feedback control. The disadvantage of this level shifter is the large size required for the pull-down transistors and increased active energy caused by the stacked transistor 406 in the pull-down path which is already weaker than the pull-up path. The asymmetry between the pull-up path and the pull-down path may also cause the circuit to lose its balance of rise and fall delay or even fail at lower voltages.

FIG. 5 shows a schematic 500 of a level shifter. The level shifter may include a inverter stage 502 and a modified current mirror level shifter stage 504. The inverter stage 502 may include a NMOS transistor 506 and a PMOS transistor 508. The modified current mirror level shifter stage 504 may include NMOS transistors 510, 512 as well as PMOS transistors 514, 516, 518. The NMOS transistors 510, 512 as well as PMOS transistors 514, 516, 518 form a Wilson current mirror. The level shifter uses feedback control (i.e. transistor 514) to disable the static current path through transistors 510, 516 to reduce the standby leakage current. However, disabling the static current path causes a voltage drop at the output when the output voltage is high due to the reduced mirror current. This creates another static current path in the subsequent buffer circuit and high standby leakage. Also, the transistor 518 is half activated (half ON) for low output which increases standby leakage power and fall delay. Increasing the size of transistor 518 may reduce the output voltage drop and reduce leakage current but may increase the standby leakage current for low output and increase the fall delay.

FIG. 6 shows a schematic 600 of a level shifter. The level shifter includes a level shifter stage including NMOS transistors 602, 604 and PMOS transistors 606, 608 arranged in the cross-coupled PMOS configuration. The level shifter further includes input inverters 610, 612. The level shifter further includes a substrate bias circuit 614 and a comparator 616 to apply forward body bias to the pull-down transistors 606, 608 for reducing propagation delays during transitions and apply reverse body-bias to reduce standby leakage out of transitions. However, this requires triple well technology and large area overhead caused by well separation, body bias-control and output detection. In addition, forward body-bias itself consumes leakage power.

SUMMARY

In various embodiments, a circuit arrangement may be provided. The circuit arrangement may include a level shifting stage configured to be coupled to a first reference voltage, the level shifting stage having an output node. The circuit arrangement may further include a first input electrode in electrical connection with the level shifting stage for coupling a first input voltage. The circuit arrangement may also include a second input electrode in electrical connection with the level shifting stage for coupling a second input voltage. The circuit arrangement may further include a load having a first end and a second end, the first end coupled to the level shifting stage and the second end for coupling to a second reference voltage. In addition, the circuit arrangement may include a bypass circuit element connected in parallel to the load. The bypass circuit element may have a first end and a second end, the first end coupled to the level shifting stage and a second end for coupling to the second reference voltage. The first input voltage may be configured to switch between a first logic state and a second logic state and the second input voltage may be configured to switch between the second logic state and the first logic state. The level shifting stage may be configured to generate a first output voltage at the output node when the first input voltage is in the first logic state and the second input voltage is in the second logic state. The level shifting stage may be configured to generate a second output voltage at the output node when the first input voltage is in the second logic state and the second input voltage is in the first logic state. The bypass circuit element may be configured to allow current to flow through upon application of an external voltage for bypassing the load.

In various embodiments, a method may be provided. The method may include coupling a level shifting stage to a first reference voltage. The method may also include coupling a first end of a load to the level shifting stage and a second end of the load to a second reference voltage. The method may additionally include coupling a first end of a bypass circuit element to the level shifting stage and a second end of the bypass circuit element to a second reference voltage such that the circuit element is in parallel to the load. The method may further include applying a first input voltage to a first input electrode in electrical connection with the level shifting stage, the first input voltage configured to switch between a first logic state and a second logic state. The method may also include applying a second input voltage to a second input electrode in electrical connection with the level shifting stage, the second input voltage configured to switch between the second logic state and the first logic state. The level shifting stage may be configured to generate a first output voltage at an output node of the level shifting stage when the first input voltage is in the first logic state and the second input voltage is in the second logic state. The level shifting stage may be configured to generate a second output voltage at the output node when the first input voltage is in the second logic state and the second input voltage is in the first logic state. The method may further include applying an external voltage to the bypass circuit element to allow current to flow through upon application of an external voltage for bypassing the load.

In various embodiments, a circuit arrangement may be provided. The circuit arrangement may include a level shifting stage coupled to a first reference voltage. The circuit arrangement may further include a first input electrode in electrical connection with the level shifting stage for coupling a first input voltage. The circuit arrangement may also include a second input electrode in electrical connection with the level shifting stage for coupling a second input voltage. The circuit arrangement may additionally include an output electrode in electrical connection with the level shifting stage for providing one of a first output voltage and a second output voltage. The circuit arrangement may further include a feedback circuit coupled with the level shifting stage, the output electrode and a second reference voltage. The first input voltage may be configured to switch between a first logic state and a second logic state. The second input voltage may be configured to switch between the second logic state and the first logic state. The level shifting stage may be configured to generate the first output voltage when the first input voltage is in the first logic state and the second input voltage is in the second logic state. The level shifting stage may be configured to generate the second output voltage when the first input voltage is in the second logic state and the second input voltage is in the first logic state. The feedback circuit may be configured to maintain the first output voltage at the output electrode above a predetermined level when the first input voltage is in the first logic state and the second input voltage is in the second logic state.

In various embodiments, a method may be provided. The method may include coupling a level shifting stage to a first reference voltage. The method may also include coupling a feedback circuit with the level shifting stage, an output electrode and a second reference voltage. The output electrode may be in electrical connection with the level shifting stage. The method may further include applying a first input voltage to a first input electrode in electrical connection with the level shifting stage, the first input voltage switching between a first logic state and a second logic state. The method may additionally include applying a second input voltage to a second input electrode in electrical connection with the level shifting stage, the second voltage input switching between the second logic state and the first logic state. The level shifting stage may be configured to generate a first output voltage at the output electrode when the first input voltage is in the first logic state and the second input voltage is in the second logic state. The level shifting stage may be configured to generate a second output voltage at the output electrode when the first input voltage is in the second logic state and the first input voltage is in the first logic state. The feedback circuit may be configured to maintain the first output voltage at the output electrode above a predetermined level when the first input voltage is in the first logic state and the second input voltage is in the second logic state.

BRIEF DESCRIPTION OF THE DRAWINGS

The invention will be better understood with reference to the detailed description when considered in conjunction with the non-limiting examples and the accompanying drawings, in which:

FIG. 9 shows a schematic of a method of operating a circuit arrangement according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

Figure 1A:
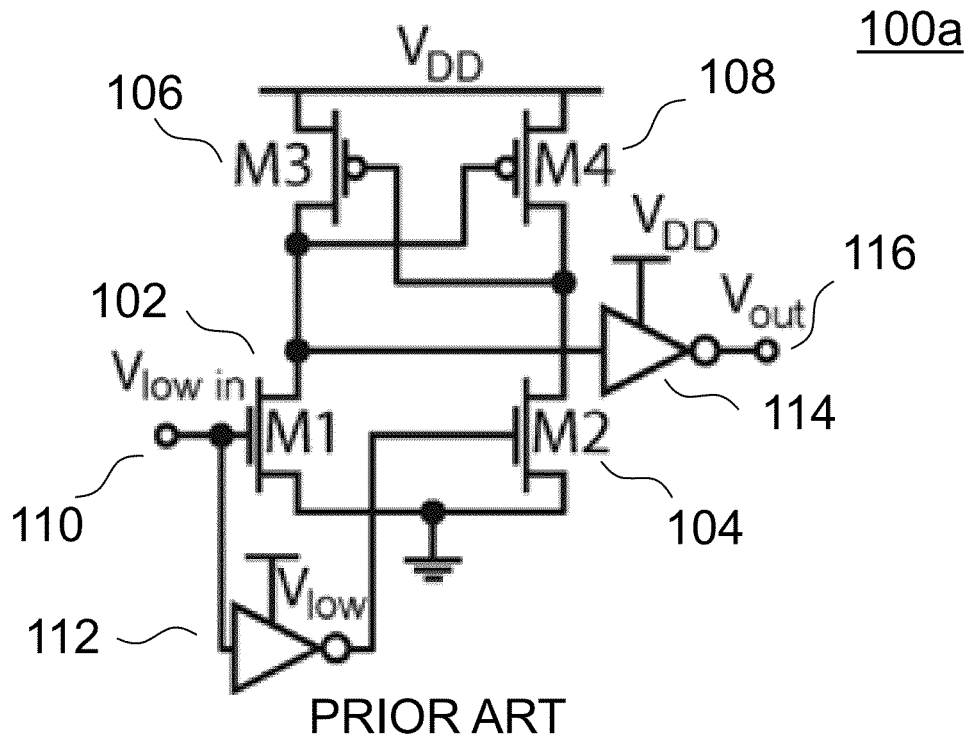
FIG. 1A shows a schematic of a level shifter based on the cross-coupled p-channel metal oxide field effect semiconductor (PMOS) transistors configuration.
Figure 1B:
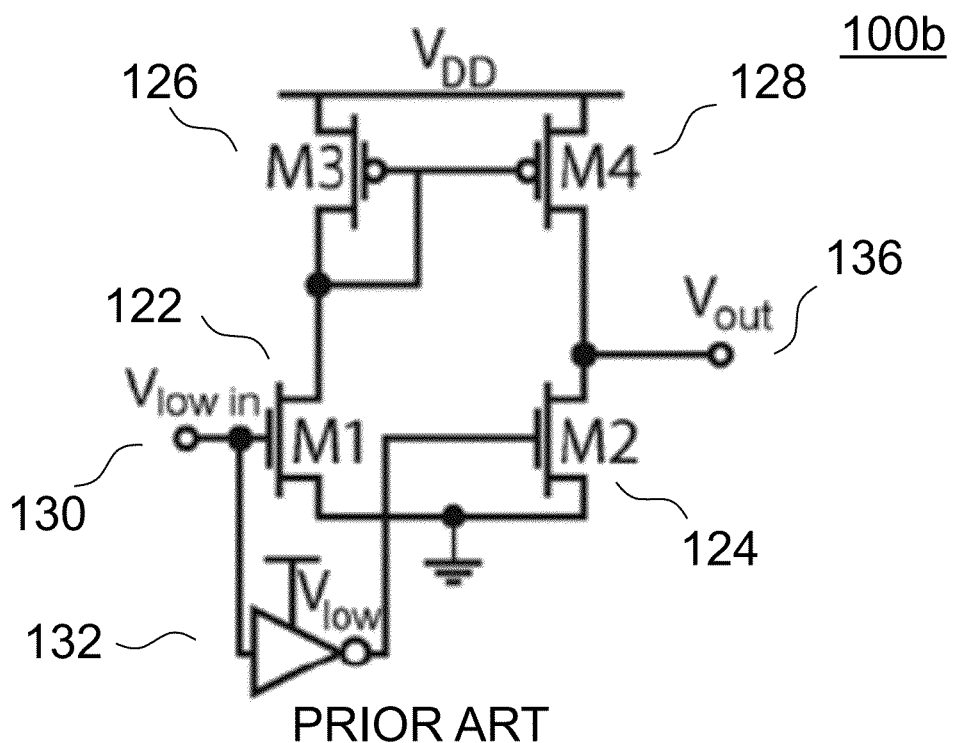
FIG. 1B shows a schematic of a level shifter based on the current mirror configuration.
Figure 2:
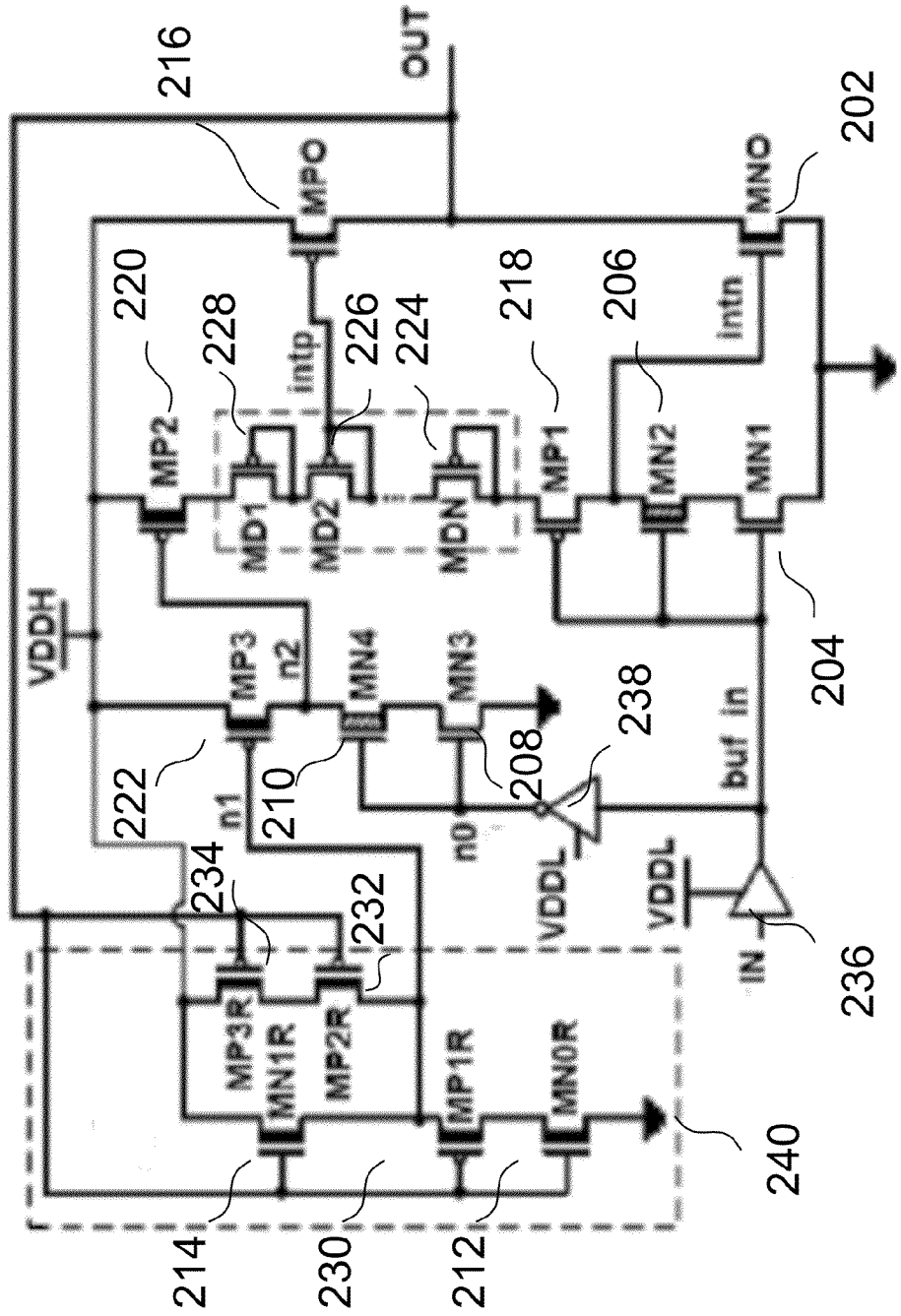
FIG. 2 shows a schematic of a level shifter.
Figure 3:
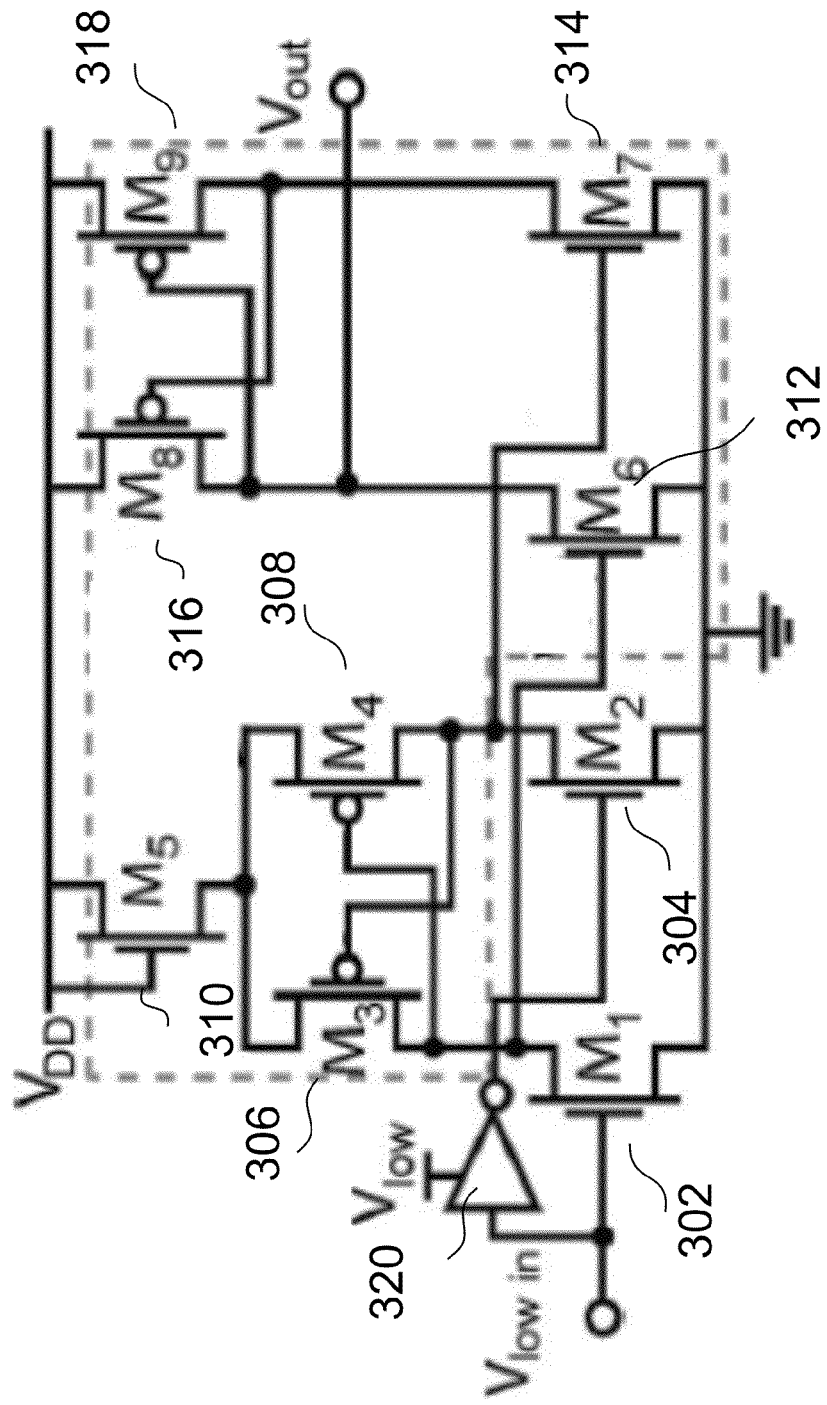
FIG. 3 shows a schematic of a level shifter.
Figure 4:
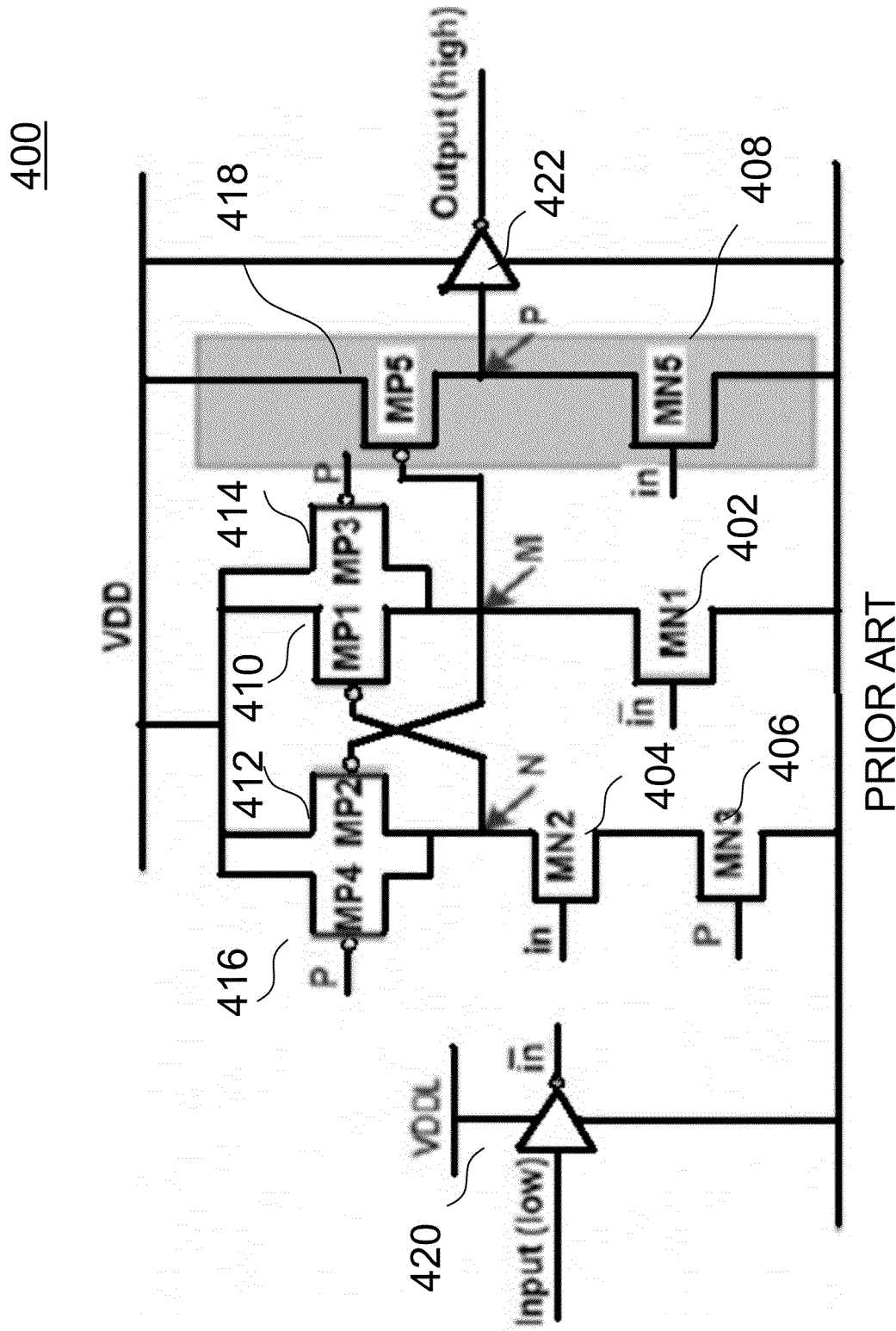
FIG. 4 shows a schematic of a level shifter.
Figure 5:
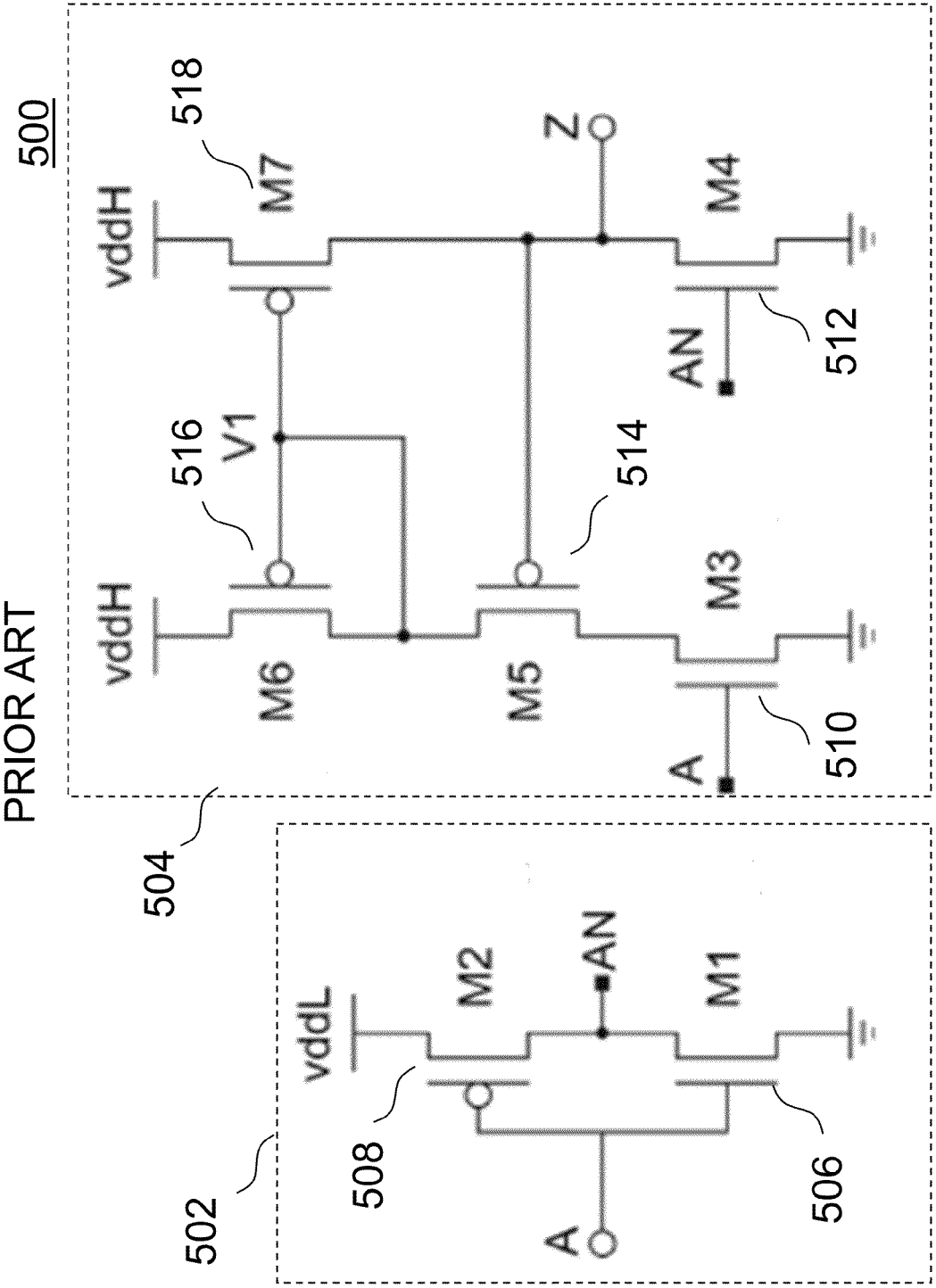
FIG. 5 shows a schematic of a level shifter.
Figure 6:
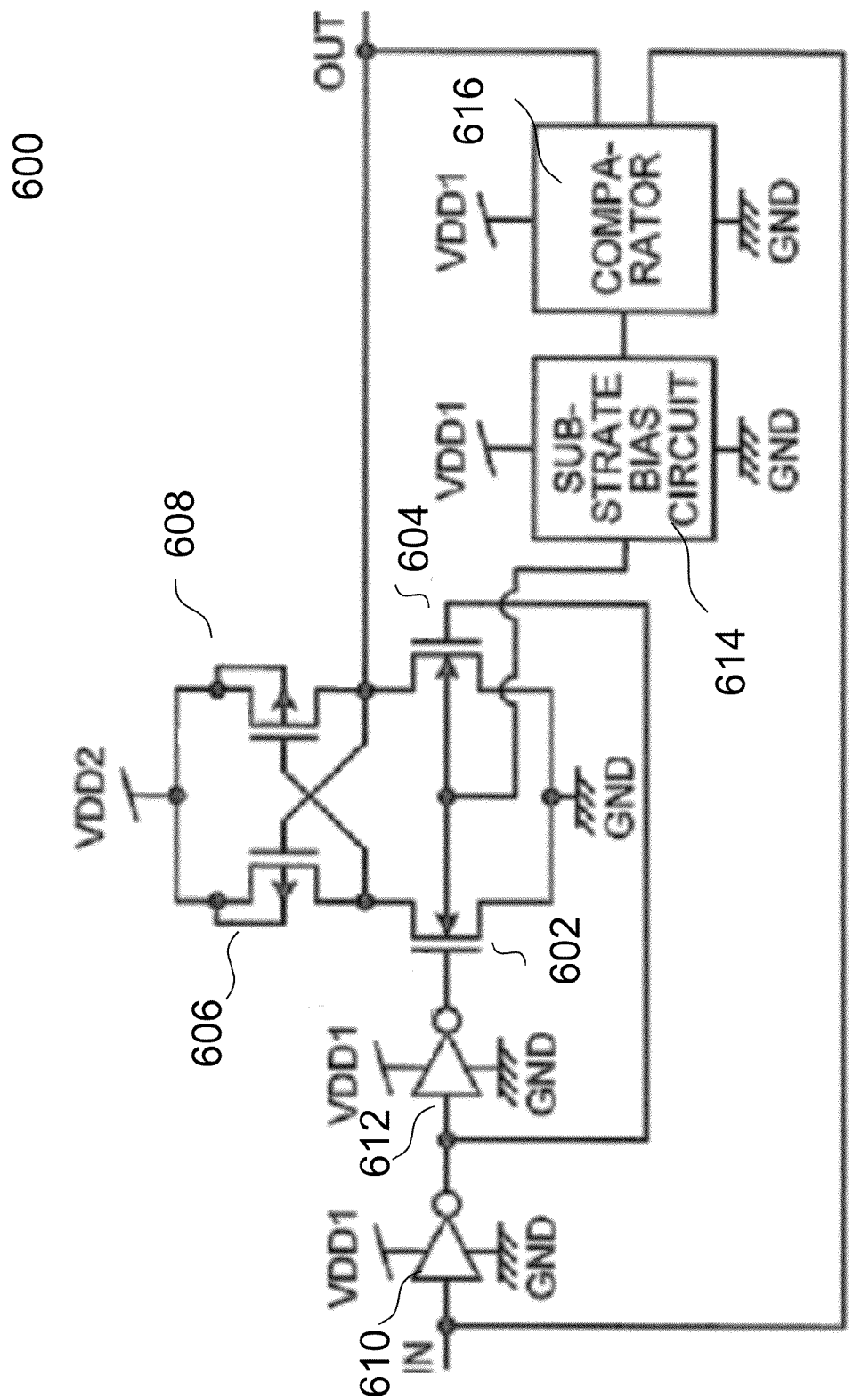
FIG. 6 shows a schematic of a level shifter.
Figure 7:
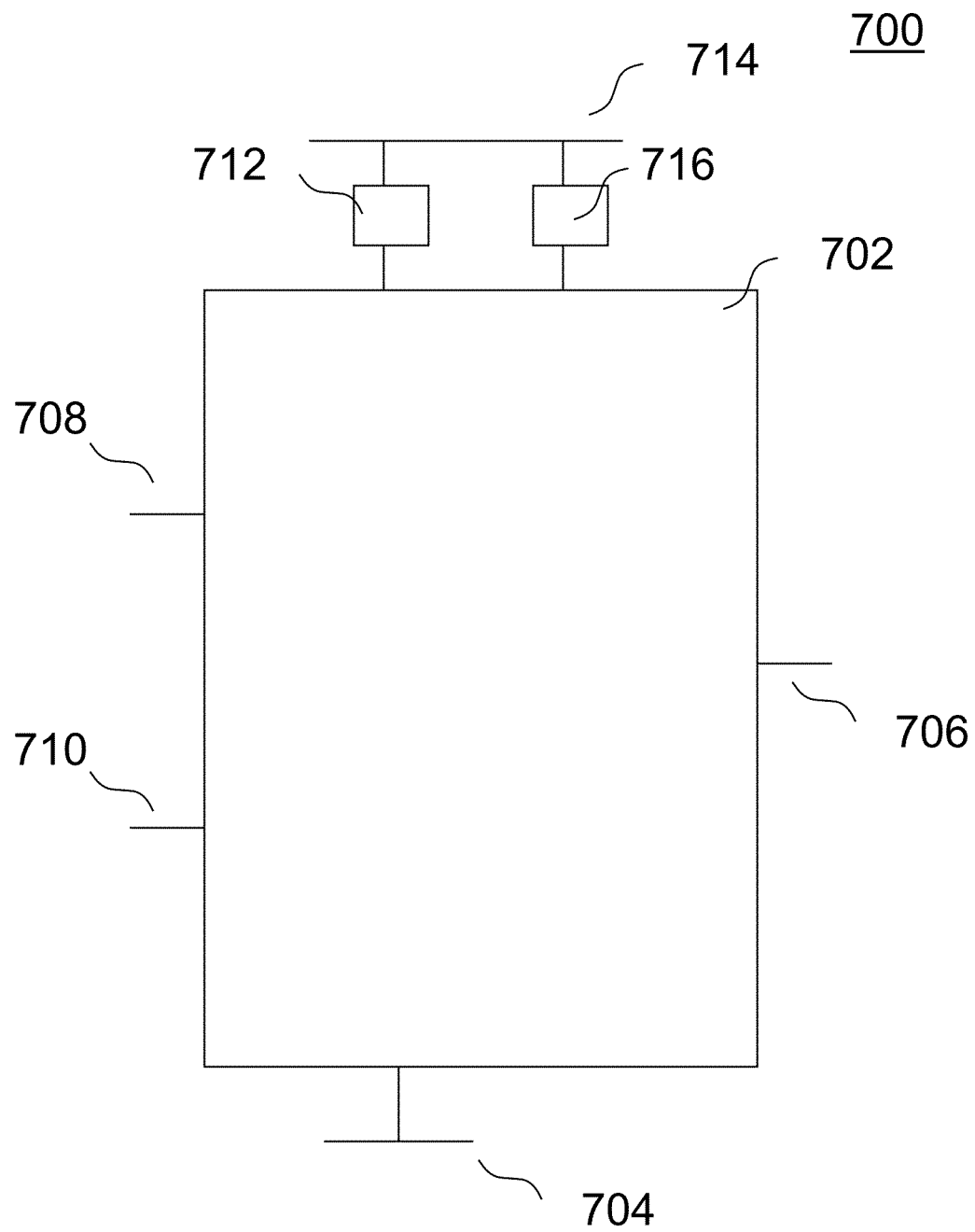
FIG. 7 shows a schematic of a circuit arrangement according to various embodiments.

FIG. 7 shows a schematic 700 of a circuit arrangement according to various embodiments. The circuit arrangement may include a level shifting stage 702 configured to be coupled to a first reference voltage 704, the level shifting stage 702 having an output node 706. The circuit arrangement may further include a first input electrode 708 in electrical connection with the level shifting stage 702 for coupling a first input voltage. The circuit arrangement may also include a second input electrode 710 in electrical connection with the level shifting stage 702 for coupling a second input voltage. The circuit arrangement may further include a load 712 having a first end and a second end, the first end coupled to the level shifting stage 702 and the second end for coupling to a second reference voltage 714. In addition, the circuit arrangement may include a bypass circuit element 716 connected in parallel to the load 712. The bypass circuit element 716 may have a first end and a second end, the first end coupled to the level shifting stage 702 and a second end for coupling to the second reference voltage 714. The first input voltage may be configured to switch between a first logic state and a second logic state and the second input voltage may be configured to switch between the second logic state and the first logic state. The level shifting stage 702 may be configured to generate a first output voltage at the output node 706 when the first input voltage is in the first logic state and the second input voltage is in the second logic state. The level shifting stage 702 may be configured to generate a second output voltage at the output node 706 when the first input voltage is in the second logic state and the second input voltage is in the first logic state. The bypass circuit element 716 may be configured to allow current to flow through upon application of an external voltage for bypassing the load 712.

In other words, the circuit arrangement may include a level shifting stage 702. The level shifting stage 702 may be connected to a first input electrode 708 and a second input electrode 710. A first input voltage may be applied to the first input electrode 708 and a second input voltage may be applied to the second input electrode 710. The first input voltage may have voltages representing a first logic state and a second logic state. Similarly, the second input voltage may have voltages representing a first logic state and a second logic state. When a first input voltage representing a first logic state is applied to the first input electrode 708, a second input voltage representing a second logic state may be applied to the second input electrode 710. Conversely, when a first input voltage representing the second logic state is applied to the first input electrode 708, a second input voltage representing the first logic state may be applied to the second input electrode 710. The level shifting stage 702 may further include an output node 706. The level shifting stage 702 may be configured to generate a first output voltage at the output node 706 when the first input voltage representing the first logic state is applied to the first input electrode 708 and the second input voltage representing the second logic state is applied to the second input electrode 710. Conversely, the level shifting stage 702 may be configured to generate a second output voltage at the output node 706 when the first input voltage representing the second logic state is applied to the first input electrode 708 and the second input voltage representing the first logic state is applied to the second input electrode 710. The level shifting stage 702 may be connected to a first reference voltage 704 and a second reference voltage 714 which may act as supply voltages. The circuit arrangement may further include a load 712 between the level shifting stage and the second reference voltage 714. In addition, the circuit arrangement may further include a bypass circuit element 716 between the level shifting stage 702 and the second reference voltage 714, i.e. in parallel to the load 712. The bypass circuit element 716 may be configured to allow current to flow through upon application of an external voltage for bypassing the load 712.

In various embodiments, a first circuit element or electrode or end coupled to a second circuit element or electrode or end may refer to the first circuit element or electrode or end in electrical connection to the second circuit element or electrode or end without any intervening circuit element that stops or changes the direction of current flow between the first circuit element or electrode or end and the second circuit element or electrode or end. "Couple", "couples", "coupling" may have corresponding meanings.

In various embodiments, a first circuit element or electrode or end directly coupled to a second circuit element or electrode or end may refer to the first circuit element or electrode or end in electrical connection to the second circuit element or electrode or end without any intervening circuit element that stops or changes the direction of current flow between the first circuit element or electrode or end and the second circuit element or electrode or end or causes a voltage drop between the first circuit element or electrode or end and the second circuit element or electrode or end. "Directly couple", "directly couples", "direct coupling" may have corresponding meanings.

In various embodiments, "activated" may have the same meaning as "turned on" or "switched on" or "enabled". When a circuit element is "activated" or "turned on" or "switched on" or "enabled", the circuit element may allow a substantial current to flow through. In various embodiments, "deactivated" may have the same meaning as "turned off" or "switched off" or "disabled". When a circuit element is "deactivated" or "turn off" or "switched off" or "disabled", the circuit element may not allow a current to flow through or may allow only a small, often insubstantial, amount of current to flow through. A circuit element may have a first logic state ("activated" or "on" or "turned on" or "switched on" or "enabled") and a second logic state ("deactivated" or "off" or "turned off" or "switched off" or "disabled"). The current flowing through the circuit element in the first logic state is greater, often significantly, than the current flowing through the circuit element in the second logic state.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with alternative embodiments.

In various embodiments, a transistor may include a metal oxide semiconductor field effect transistor (MOSFET). In various alternate embodiments, the transistor may include a bipolar junction transistor (BJT).

In various embodiments, the control electrode of a transistor may include the gate electrode of a MOSFET. The first controlled electrode of a transistor may include the drain electrode of a MOSFET while the second controlled electrode of the transistor may include the source electrode of the MOSFET. In various alternate embodiments, the first controlled electrode of a transistor may include the source electrode of a MOSFET while the second controlled electrode of the transistor may include the drain electrode of the MOSFET.

In various embodiments, the control electrode of a transistor may include the base electrode of a BJT. The first controlled electrode of a transistor may include the collector electrode of a BJT while the second controlled electrode of the transistor may include the emitter electrode of the BJT. In various alternate embodiments, the first controlled electrode of a transistor may include the emitter electrode of a BJT while the second controlled electrode of the transistor may include the collector electrode of the BJT.

In various embodiments, the logic state of the second input voltage may different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The circuit arrangement may be configured such that when a first input voltage in the first logic state is applied to the first input electrode 708, a second input voltage in the second logic state is applied to the second input electrode 710. Conversely, the circuit arrangement may be configured such that when a first input voltage in the second logic state is applied to the first input electrode 708, a second input voltage in the first logic state is applied to the second input electrode 710. The circuit arrangement may further include an input inverter having a first electrode and a second electrode. The first electrode (of the input inverter) may be coupled to the first input electrode 708 and the second electrode (of the input inverter) may be coupled to the second input electrode 710. The input inverter may invert the logic state of the first input voltage applied to the first input electrode 708 and generates the second input voltage in a logic state different from the logic state of the first input voltage. For example, when a high voltage is applied to the first input electrode 708, the input inverter produces a low voltage at the second electrode (of the input inverter) and applies the low voltage to the second input electrode 710. Conversely, when a low voltage is applied to the first input electrode 708, the input inverter produces a high voltage at the second electrode (of the input inverter) and applies the high voltage to the second input electrode 710.

In various embodiments, the first output voltage may represent the first logic state and the second output voltage may represent the second logic state.

The circuit arrangement may be a level shifter or may be a part of a level shifter.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state.

The voltage of the first input voltage in the first logic state may be substantially equal to the voltage of the second input voltage in the first logic state. The voltage of the first input voltage in the second logic state may be substantially equal to the voltage of the second input voltage in the second logic state.

The first output voltage may be substantially equal or below the second reference voltage 714. For instance, the first output voltage may be substantially equal to the second reference voltage subtracted by the voltage drop across the load 712 when the bypass circuit 716 is deactivated. The first output voltage may be substantially equal to the second reference voltage 714 when the bypass circuit 716 is activated.

The level shifting stage 702 may shift the first input voltage (in a first logic state) to a higher voltage (first output voltage representing a first logic state). For instance, a first input voltage of about 1V (representing "high" state) may be applied to the first input electrode 708. The input inverter may generate a second input voltage (representing "low" state) to the second input electrode 710. The level shifting stage 702 may in electrical connection to a second reference voltage (i.e. supply voltage) 714 of about 5V via the load 712 and/or the bypass circuit 716. The level shifting stage 702 may generate a first output voltage high state at the output node 706 (when a first input voltage representing "high" state is applied to the first input electrode 708 and when a second input voltage representing "low" state is applied to the second input electrode 710). The first output voltage may be substantially about 5V when the bypass circuit 716 is activated. The first output voltage may be substantially about 4V when the bypass circuit 716 is deactivated. The level shifting stage 702 may be configured to "shift" an input voltage of a lower magnitude (e.g. about 1V) to an output voltage of a higher magnitude (e.g. about 4V or about 5V).

The first reference voltage 704 may be at ground (about 0V). A first input voltage of about 0V (representing "low" state) may be applied to the first input electrode 708. The input inverter may generate a second input voltage (representing "high" state) to the second input electrode 710. The level shifting stage 702 may generate a second output voltage substantially equal to ground (representing "low" state) at the output node 706 (when a first input voltage representing "low" state is applied to the first input electrode 708 and when a second input voltage representing "high: state is applied to the second input electrode 710). The second output voltage may be substantially equal to ground when the bypass circuit 716 is activated or when the bypass circuit 716 is deactivated.

The load 712 may cause propagation delay to not track voltage scaling well, especially when the supply voltage (i.e. the second reference voltage 714) is raised to the super-threshold region because of the nearly constant voltage drop across the load 712. The load 712 may result in degraded performance of the circuit arrangement according to various embodiments when operating in the super-threshold region and may make the circuit arrangement to be unsuitable for dynamic voltage scaling (DVS) applications.

Coupling a bypass circuit element 716 in parallel to the load 712 may at least partially improve performance of the circuit arrangement and allow for faster operation.

The bypass circuit element 716 may allow the circuit arrangement according to various embodiments to be used for supply voltages in the around threshold and the super threshold regions to be used. When the supply voltage is at around-threshold region, the bypass circuit element 716 may be disabled to weaken the pull-up path in the level shifting stage 702. When the supply voltage is at super-threshold region, the voltage drop across the load may remain fairly constant, which may in turn lead to propagation delays. The bypass circuit element 716 may be configured to allow current to flow through (i.e. activated) upon application of an external voltage for bypassing the load 712. The circuit arrangement may be further configured to apply the external voltage to the bypass circuit element 716 when the supply voltage exceeds a predetermined level. The circuit arrangement may further include a comparator circuit coupled to the second reference voltage and the bypass circuit element 716. The comparator circuit may be further coupled to a voltage fixed at a constant predetermined level. The comparator circuit may be configured to compare the second reference voltage and the voltage fixed at the predetermined level and generates the external voltage when the second reference voltage equals or exceeds the voltage at the predetermined level. The bypass circuit element 716 may be activated upon application of the external voltage.

In various embodiments, the level shifting stage 702 may include a first set of sequentially coupled pull-up and pull-down sub-circuits cross-coupled to a second set of sequentially coupled pulled-up and pull-down sub-circuits to generate a positive feedback loop.

The pull-up sub-circuit in the first set may include a first pull-up transistor. The pull-down sub-circuit in the first set may include a first pull-down transistor. In other words, the first set of sequentially coupled pull-up and pull-down sub-circuits may include the first pull-up transistor and the first pull-down transistor. The first pull-up transistor may include a control electrode, a first controlled electrode and a second controlled electrode. The first pull-down transistor may include a control electrode, a first controlled electrode and a second controlled electrode. The first pull-up transistor may be sequentially coupled to the first pull-down transistor by coupling the first controlled electrode of the first pull-up transistor to the first controlled electrode of the first pulled-down transistor.

The pull-up sub-circuit in the second set may include a second pull-up transistor. The pull-down sub-circuit in the second set may include a second pull-down transistor. In other words, the second set of sequentially coupled pull-up and pull-down sub-circuits may include the second pull-up transistor and the second pull-down transistor. The second pull-up transistor may include a control electrode, a first controlled electrode and a second controlled electrode. The second pull-down transistor may include a control electrode, a first controlled electrode and a second controlled electrode. The second pull-up transistor may be sequentially coupled to the second pull-down transistor by coupling the first controlled electrode of the second pull-up transistor to the first controlled electrode of the second pulled-down transistor.

The first set of sequentially coupled pull-up and pull-down sub-circuits cross-coupled to the second set of sequentially coupled pull-up and pull-down sub-circuits may include coupling the first controlled electrode of the first pull-down transistor to the control electrode of the second pull-up transistor. The first set of sequentially coupled pull-up and pull-down sub-circuits cross-coupled to the second set of sequentially coupled pull-up and pull-down sub-circuits may further include coupling the first controlled electrode of the second pull-down transistor to the control electrode of the first pull-up transistor.

The first end of the load 712 may be coupled to the second controlled electrode of the first pull-up transistor and/or the second controlled electrode of the second pull-up transistor. The first end of the bypass circuit element 716 may be coupled to the second controlled electrode of the first pull-up transistor and/or the second controlled electrode of the second pull-up transistor.

The second controlled electrode of the first pull-down transistor and/or the second controlled electrode of the second pull-down transistor may be coupled to the first reference voltage.

The load 712 may include a diode or a transistor. The circuit arrangement may be configured such that the diode is forward-biased. The transistor (which may also be called a load transistor) may have a control electrode and a first controlled electrode and a second controlled electrode. The transistor (load transistor) may be configured as a diode, e.g. by connecting the first controlled electrode of the transistor (load transistor) to the control electrode of the transistor (load transistor). The first controlled electrode of the transistor (load transistor) may be coupled to the second reference voltage 714. The second controlled electrode of the transistor may be coupled to the level shifting stage 702. The transistor (load transistor) may be a NMOS transistor. The diode or transistor configured as a diode may only allow current flow from the second reference voltage 714 to the level shifting stage 702.

The bypass circuit element 716 may include a bypass transistor. The bypass transistor may include a control electrode and a first controlled electrode and a second controlled electrode. The first controlled electrode of the bypass transistor may be coupled to the second reference voltage. The second controlled electrode of the bypass transistor may be coupled to the level shifting stage 702. The second controlled electrode of the bypass transistor may also be coupled to the load 712. The bypass transistor may include a PMOS transistor.

The bypass circuit element 716 may instead include any sub-circuit arrangement that allows current to flow through for bypassing the load 714 upon application of an external voltage. The external voltage may be a low signal or a high signal.

In various alternate embodiments, the bypass circuit element 716 may instead be configured such that current flows through the bypass circuit element upon termination of an external voltage. In other words, the external voltage prevents current from flowing through the circuit element. When the external voltage is terminated, current flows through the circuit element for bypassing the load 714.

The circuit arrangement may further include a delay balancer sub-circuit coupled in parallel to one of the first pull-down transistor or second pull-down transistor. The circuit arrangement may further include a delay balancer sub-circuit coupled in parallel to the first pull-down transistor. The circuit arrangement may be configured such that when the first pull-down transistor is deactivated (switched off) and before the second pull-down transistor is activated (switched on), the delay balancer circuit may remain activated. The circuit arrangement may additionally or alternatively be configured such that when the first pull-down transistor and the delay balancer sub-circuit are activated (switched on) before the second pull-down transistor is deactivated (switched off).

The delay balancer sub-circuit may include a delay balancer transistor. The delay balancer sub-circuit may further include a delay balancer inverter. The delay balancer transistor may include a control electrode, a first controlled electrode and a second controlled electrode. The first controlled electrode of the delay balancer transistor may be coupled to the first controlled electrode of the first pull-down transistor. The second controlled electrode of the delay balancer transistor may be coupled to the second controlled electrode of the first pull-down transistor. The delay balancer inverter may include a first electrode and a second electrode. The first electrode may be coupled to the second input electrode 710 and the second electrode may be coupled to the control electrode of the delay balancer transistor.

The circuit arrangement may further include a subsequent level shifting stage cascaded to the level shifting stage 702. The subsequent level shifting stage may be coupled or be directly coupled to the first reference voltage 704 and the second reference voltage 714. In various embodiments, the level shifting stage 702 may be connected to the load 712 to weaken the pull-up path while the subsequent shifting stage may be directly connected to the first reference voltage 704 and the second reference voltage 714 (without any intervening circuit elements) to achieve full output voltage swing.

In various embodiments, the subsequent level shifting stage may include a third set of sequentially coupled pull-up and pull-down sub-circuits cross-coupled to a fourth set of sequentially coupled pulled-up and pull-down sub-circuits to generate a subsequent positive feedback loop.

The pull-up sub-circuit in the third set may include a third pull-up transistor. The pull-down sub-circuit in the third set may include a third pull-down transistor. In other words, the third set of sequentially coupled pull-up and pull-down sub-circuits may include the third pull-up transistor and the third pull-down transistor. The third pull-up transistor may include a control electrode, a first controlled electrode and a second controlled electrode. The third pull-down transistor may include a control electrode, a first controlled electrode and a second controlled electrode. The third pull-up transistor may be sequentially coupled to the third pull-down transistor by coupling the first controlled electrode of the third pull-up transistor to the first controlled electrode of the third pulled-down transistor.

The pull-up sub-circuit in the fourth set may include a fourth pull-up transistor. The pull-down sub-circuit in the fourth set may include a fourth pull-down transistor. In other words, the fourth set of sequentially coupled pull-up and pull-down sub-circuits may include the fourth pull-up transistor and the fourth pull-down transistor. The fourth pull-up transistor may include a control electrode, a first controlled electrode and a second controlled electrode. The fourth pull-down transistor may include a control electrode, a first controlled electrode and a second controlled electrode. The fourth pull-up transistor may be sequentially coupled to the fourth pull-down transistor by coupling the first controlled electrode of the fourth pull-up transistor to the first controlled electrode of the fourth pulled-down transistor.

The third set of sequentially coupled pull-up and pull-down sub-circuits cross-coupled to the fourth set of sequentially coupled pull-up and pull-down sub-circuits may include coupling the first controlled electrode of the third pull-down transistor to the control electrode of the fourth pull-up transistor. The third set of sequentially coupled pull-up and pull-down sub-circuits cross-coupled to the fourth set of sequentially coupled pull-up and pull-down sub-circuits may further include coupling the first controlled electrode of the fourth pull-down transistor to the control electrode of the third pull-up transistor.

The subsequent level shifting stage cascaded to the level shifting stage may include coupling the first controlled electrode of the first pull-down transistor to the control electrode of the third pull-down transistor. The subsequent level shifting stage cascaded to the level shifting stage may alternatively or additionally, include coupling the first controlled electrode of the second pull-down transistor to the control electrode of the fourth pull-down transistor.

The subsequent shifting stage may further include a further output electrode. The output electrode may be coupled to the first controlled electrode of the third pull-down transistor.

Advantageously, the subsequent level shifting stage coupled to the first reference voltage and the second reference voltage allows a voltage to be generated at the output electrode ranging from the first reference voltage to the second reference voltage.

In various embodiments, the pull-down transistors may be configured according to minimum width finger sizing method for reducing threshold voltages to increase driving current. By applying the minimum width sizing method, the inverse narrow width effect (INWE) is utilized. Due to the inverse narrow width effect (INWE), the threshold voltages of the transistors are increased as the transistor width are increased from minimum, which may lead to reduced driving current. The circuit arrangement may include pull-down transistors having minimum width transistors for achieving the low threshold voltages and increase driving current for reducing delay, especially at low voltages. Additionally, the size of the pull-down transistors may be reduced (due to increased driving current), which may further reduce delay as well as power consumption.

The pull-down transistors may be configured according to minimum width finger sizing method. The pull-down transistors may be configured according to minimum width finger sizing method by folding each transistor into multiple folded transistors (also called "fingers") having an equivalent current drive as the transistor when connected properly in combination. Each of the folded transistors may have a reduced width. Configuring each transistor may further include sharing drain and/or source electrodes between the folded transistors.

In various embodiments, the pull-down transistors are n-channel metal oxide semiconductor field effect transistors (MOSFETs). In various embodiments, the pull-up transistors are p-channel metal oxide semiconductor field effect transistors (MOSFETs).

Figure 8:
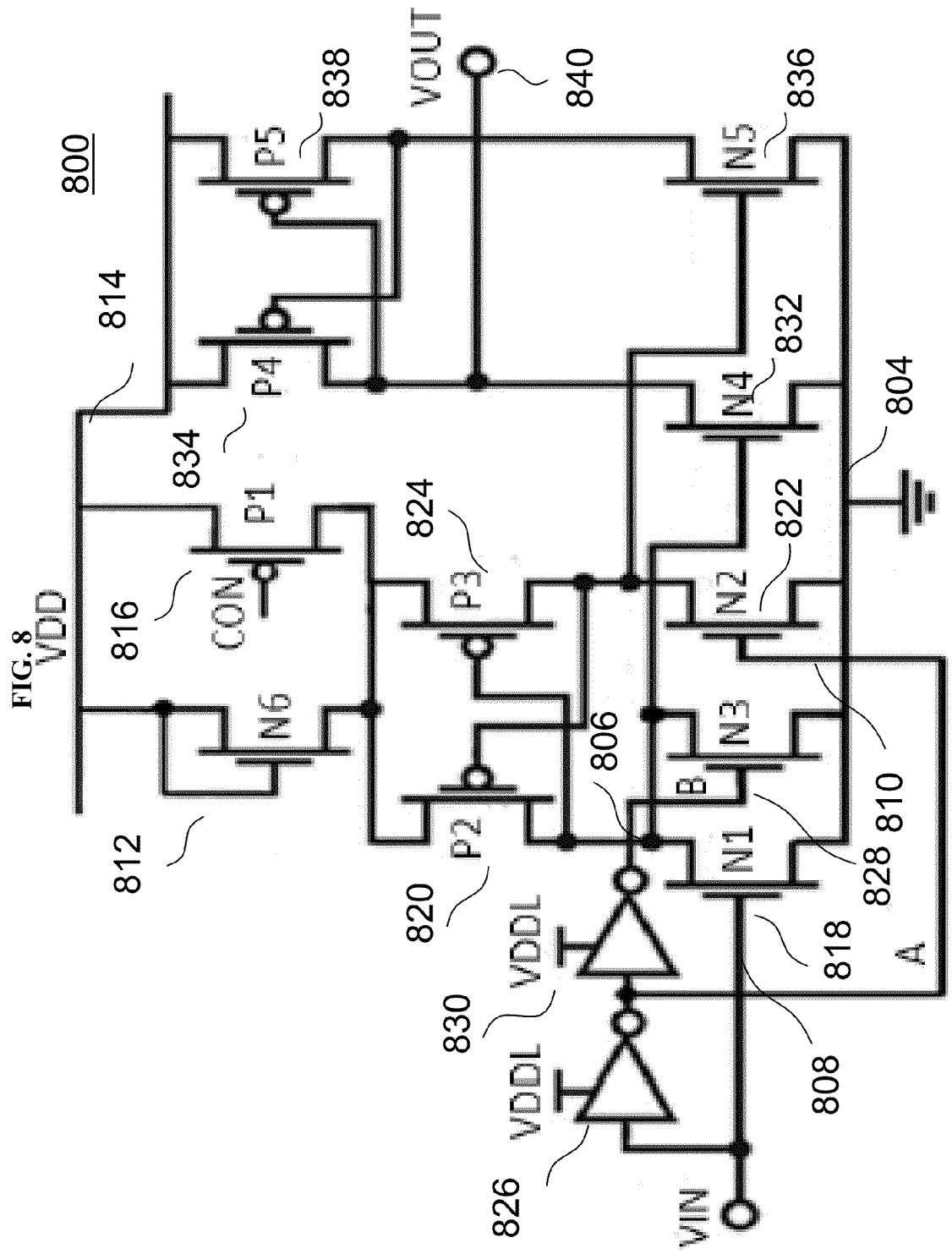
FIG. 8 shows a schematic of a circuit arrangement according to various embodiments.

FIG. 8 shows a schematic 800 of a circuit arrangement according to various embodiments. The circuit arrangement may include a level shifting stage configured to be coupled to a first reference voltage 804, the level shifting stage having an output node 806. The circuit arrangement may further include a first input electrode 808 in electrical connection with the level shifting stage for coupling a first input voltage. The circuit arrangement may also include a second input electrode 810 in electrical connection with the level shifting stage for coupling a second input voltage. The circuit arrangement may further include a load 812 having a first end and a second end, the first end coupled to the level shifting stage and the second end for coupling to a second reference voltage. In addition, the circuit arrangement may include a bypass circuit element connected in parallel to the load 812. The bypass circuit element 816 may have a first end and a second end, the first end coupled to the level shifting stage and a second end for coupling to the second reference voltage 814. The first input voltage may be configured to switch between a first logic state and a second logic state and the second input voltage may be configured to switch between the second logic state and the first logic state. The level shifting stage may be configured to generate a first output voltage at the output node 806 when the first input voltage is in the first logic state and the second input voltage is in the second logic state. The level shifting stage may be configured to generate a second output voltage at the output node 806 when the first input voltage is in the second logic state and the second input voltage is in the first logic state. The bypass circuit element 816 may be configured to allow current to flow through upon application of an external voltage for bypassing the load 812.

In other words, the circuit arrangement may include a level shifting stage. The level shifting stage may be connected to a first input electrode 808 and a second input electrode 810. A first input voltage may be applied to the first input electrode 808 and a second input voltage may be applied to the second input electrode 810. The first input voltage may have voltages representing a first logic state and a second logic state. Similarly, the second input voltage may have voltages representing a first logic state and a second logic state. When a first input voltage representing a first logic state is applied to the first input electrode 808, a second input voltage representing a second logic state may be applied to the second input electrode 810. Conversely, when a first input voltage representing the second logic state is applied to the first input electrode 808, a second input voltage representing the first logic state may be applied to the second input electrode 810. The level shifting stage may further include an output node 806. The level shifting stage may be configured to generate a first output voltage at the output node 806 when the first input voltage representing the first logic state is applied to the first input electrode 808 and the second input voltage representing the second logic state is applied to the second input electrode 810. Conversely, the level shifting stage may be configured to generate a second output voltage at the output node 806 when the first input voltage representing the second logic state is applied to the first input electrode 808 and the second input voltage representing the first logic state is applied to the second input electrode 810. The level shifting stage may be connected to a first reference voltage 804 and a second reference voltage 814 which may act as supply voltages. The circuit arrangement may further include a load 812 between the level shifting stage and the second reference voltage 814. In addition, the circuit arrangement may further include a bypass circuit element 816 between the level shifting stage and the second reference voltage 814, i.e. in parallel to the load 812. The bypass circuit element 816 may be configured to allow current to flow through upon application of an external voltage for bypassing the load 814.

In various embodiments, the level shifting stage may include first pull-down transistor 818, first pull-up transistor 820, second pull-down transistor 822 and second pull-down transistor 824.

In various embodiments, the logic state of the second input voltage may different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The circuit arrangement may be configured such that when a first input voltage in the first logic state is applied to the first input electrode 808, a second input voltage in the second logic state is applied to the second input electrode 810. Conversely, the circuit arrangement may be configured such that when a first input voltage in the second logic state is applied to the first input electrode 808, a second input voltage in the first logic state is applied to the second input electrode 810. The circuit arrangement may further include an input inverter 826 having an first electrode and a second electrode. The first electrode may be coupled to the first input electrode 808 and the second electrode may be coupled to the second input electrode 810. The input inverter 826 may invert the logic state of the first input voltage applied to the first input electrode 808 and generates the second input voltage in a logic state different from the logic state of the first input voltage. For example, when a high voltage is applied to the first input electrode 808, the input inverter 826 produces a low voltage at the second electrode (of the input inverter 826) and applies the low voltage to the second input electrode 810. Conversely, when a low voltage is applied to the first input electrode 808, the input inverter produces a high voltage at the second electrode (of the input inverter 826) and applies the high voltage to the second input electrode 810.

In various embodiments, the first output voltage may represent the first logic state and the second output voltage may represent the second logic state.

The circuit arrangement may be a level shifter or may be a part of a level shifter.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state.

The voltage of the first input voltage in the first logic state may be substantially equal to the voltage of the second input voltage in the first logic state. The voltage of the first input voltage in the second logic state may be substantially equal to the voltage of the second input voltage in the second logic state.

The first output voltage may be substantially equal or below the second reference voltage 814. For instance, the first output voltage may be substantially equal to the second reference voltage subtracted by the voltage drop across the load 812 when the bypass circuit 816 is deactivated. The first output voltage may be substantially equal to the second reference voltage 814 when the bypass circuit 816 is activated.

The level shifting stage shifts the first input voltage (in a first logic state e.g. "high" state) to a higher voltage (first output voltage representing a first logic state e.g. "high" state). For instance, a first input voltage of about 1V (representing "high" state) may be applied to the first input electrode 808. The input inverter may generate a second input voltage (representing "low" state) to the second input electrode 810. The level shifting stage may be coupled to a second reference voltage (i.e. supply voltage) 814 of about 5V. The level shifting stage may generate a first output voltage "high" state at the output node 806 (when a first input voltage representing high state is applied to the first input electrode 808 and when a second input voltage representing "low" state is applied to the second input electrode 810). The first output voltage may be substantially about 5V when the bypass circuit 816 is activated. The first output voltage may be substantially about 4V when the bypass circuit 816 is deactivated. The level shifting stage may be configured to "shift" an input voltage of a lower magnitude (e.g. about 1V) to an output voltage of a higher magnitude (e.g. about 4V or about 5V).

In various embodiments, the first reference voltage 804 is at ground. In various embodiments, the second reference voltage 814 is at VDD. The second reference voltage 814 may include a voltage in the super-threshold region or a voltage in the near-threshold or about-threshold region.

The first reference voltage 804 may be at ground (about 0V). A first input voltage of about 0V (representing "low" state) may be applied to the first input electrode 808. The input inverter may generate a second input voltage (representing high state) to the second input electrode 810. The level shifting stage may generate a second output voltage substantially equal to ground (representing "low" state) at the output node 806 (when a first input voltage representing "low" state is applied to the first input electrode 808 and when a second input voltage representing "high" state is applied to the second input electrode 810). The second output voltage may be substantially equal to ground when the bypass circuit 816 is activated or when the bypass circuit 816 is deactivated.

The load 812 may help to weaken the pull-up path.

However, the load 812 may cause propagation delay to not track voltage scaling well, especially when the supply voltage (i.e. the second reference voltage 814) is raised to the super-threshold region because of the nearly constant voltage drop across the load 812. The load 812 may result in degraded performance of the circuit arrangement when operating in the super-threshold region and may make the circuit arrangement to be unsuitable for dynamic voltage scaling (DVS) applications.

Coupling a bypass circuit element 816 in parallel to the load 812 may at least partially improve performance of the circuit arrangement and allow for faster operation.

The bypass circuit element 816 may allow the circuit arrangement to be used for supply voltages in the around threshold and the super threshold regions to be used. When the supply voltage (i.e. second reference voltage 814) is at around-threshold region, the bypass circuit element 816 may be disabled to weaken the pull-up path in the level shifting stage. The voltage at the second controlled electrode of the pull-up transistors 820, 824 may be decreased by the voltage drop across the load 812 (i.e. second reference voltage subtracted by voltage drop across load 812). When the supply voltage (second reference voltage 814) increases above the super-threshold region, the voltage drop across the load may remain fairly constant. The voltage drop may in turn lead to propagation delays. The bypass circuit element 816 may be configured to allow current to flow through (i.e. activated) upon application of an external voltage for bypassing the load 812. The circuit arrangement may be further configured to apply the external voltage to the bypass circuit element 816 when the supply voltage exceeds a predetermined level. The bypass circuit element 816 may at least partially improve performance of the circuit arrangement and allow for faster operation when the supply voltage (i.e. second reference voltage 814) is at super-threshold region. When operating in the about-threshold or near-threshold region, the bypass circuit element 816 may be disable so that the load 812 may be used to weaken the pull-up path.

In various embodiments, the level shifting stage may include a first set of sequentially coupled pull-up and pull-down sub-circuits cross-coupled to a second set of sequentially coupled pulled-up and pull-down sub-circuits to generate a positive feedback loop.

The pull-up sub-circuit in the first set may include a first pull-up transistor 820. The pull-down sub-circuit in the first set may include a first pull-down transistor 818. In other words, the first set of sequentially coupled pull-up and pull-down sub-circuits may include the first pull-up transistor 820 and the first pull-down transistor 818. The first pull-up transistor 820 may include a control electrode, a first controlled electrode and a second controlled electrode. The first pull-down transistor 818 may include a control electrode, a first controlled electrode and a second controlled electrode. The first pull-up transistor 820 may be sequentially coupled to the first pull-down transistor 818 by coupling the first controlled electrode of the first pull-up transistor 820 to the first controlled electrode of the first pulled-down transistor 818.

The pull-up sub-circuit in the second set may include a second pull-up transistor 824. The pull-down sub-circuit in the second set may include a second pull-down transistor 822. In other words, the second set of sequentially coupled pull-up and pull-down sub-circuits may include the second pull-up transistor 824 and the second pull-down transistor 822. The second pull-up transistor 824 may include a control electrode, a first controlled electrode and a second controlled electrode. The second pull-down transistor 822 may include a control electrode, a first controlled electrode and a second controlled electrode. The second pull-up transistor 824 may be sequentially coupled to the second pull-down transistor 822 by coupling the first controlled electrode of the second pull-up transistor 824 to the first controlled electrode of the second pulled-down transistor 822.

The first set of sequentially coupled pull-up and pull-down sub-circuits cross-coupled to the second set of sequentially coupled pull-up and pull-down sub-circuits may include coupling the first controlled electrode of the first pull-down transistor 818 to the control electrode of the second pull-up transistor 824. The first set of sequentially coupled pull-up and pull-down sub-circuits cross-coupled to the second set of sequentially coupled pull-up and pull-down sub-circuits may further include coupling the first controlled electrode of the second pull-down transistor 822 to the control electrode of the first pull-up transistor 820.

In various embodiments, the first input electrode 808 may be or may be coupled to the control electrode of the first pull-down transistor 818. The second input electrode 810 may be or may be coupled to the control electrode of the second pull-down transistor 822.

The first end of the load 812 may be coupled to the second controlled electrode of the first pull-up transistor 820 and/or the second controlled electrode of the second pull-up transistor 824. The first end of the bypass circuit element 816 may be coupled to the second controlled electrode of the first pull-up transistor 820 and/or the second controlled electrode of the second pull-up transistor 824.

The second controlled electrode of the first pull-down transistor 818 and/or the second controlled electrode of the second pull-down transistor 822 may be coupled to the first reference voltage 804.

The load 812 may include a diode or a transistor. The circuit arrangement may be configured such that the diode is forward-biased. The transistor (which may also be called a load transistor) may have a control electrode and a first controlled electrode and a second controlled electrode. The transistor (load transistor) may be configured as a diode, e.g. by connecting the first controlled electrode of the transistor (load transistor) to the control electrode of the transistor (load transistor). The first controlled electrode of the transistor (load transistor) may be coupled to the second reference voltage 814. The second controlled electrode of the transistor may be coupled to the level shifting stage. The transistor (load transistor) may be a NMOS transistor.

The bypass circuit element 816 may include a bypass transistor. The bypass transistor may include a control electrode and a first controlled electrode and a second controlled electrode. The first controlled electrode of the bypass transistor may be coupled to the second reference voltage 814. The second controlled electrode of the bypass transistor may be coupled to the level shifting stage. The second controlled electrode of the bypass transistor may also be coupled to the load 812. The bypass transistor may include a PMOS transistor.

The bypass circuit element 816 may instead include any sub-circuit arrangement that allows current to flow through for bypassing the load 814 upon application of an external voltage. The external voltage may be a low signal or a high signal.

The bypass circuit element 816 may instead be configured such that current flows through the bypass circuit element 816 upon termination of an external voltage. In other words, the external voltage prevents current from flowing through the circuit element. When the external voltage is terminated, current flows through the circuit element for bypassing the load 814.

One way to reduce fall delay is to balance the arrival time of the first input voltage and the second input voltage by delaying the first input voltage to the control electrode of the first pull-down transistor 818. However, delaying the arrival time of the first input voltage may increase the rise delay due to reduced overlapped on time of the first pull-down transistor 818 and the second pull-down transistor 822.

The circuit arrangement may further include a delay balancer sub-circuit coupled in parallel to the first pull-down transistor 818. The circuit arrangement may be configured such that when the first pull-down transistor 818 is deactivated (switched off) and before the second pull-down transistor is activated 822 (switched on), the delay balancer circuit may remain activated. Advantageously, the transconductance and/or the fall delay of the circuit arrangement may be reduced. The circuit arrangement may additionally or alternatively be configured such that when the first pull-down transistor 818 and the delay balancer sub-circuit are activated (switched on) before the second pull-down transistor 822 is deactivated (switched off). A small rise delay may result. In addition, the overlapping of the "on" time of transistors 822, 828 during fall transition may increase the short current slightly. However, switching energy may remain substantially the same as without the delay balancer sub-circuit since the delay is reduced.

Alternatively, the circuit arrangement may include a delay balancer sub-circuit coupled in parallel to the second pull-down transistor 822.

The delay balancer sub-circuit may include a delay balancer transistor 828. The delay balancer sub-circuit may further include a delay balancer inverter 830. The delay balancer transistor 828 may include a control electrode, a first controlled electrode and a second controlled electrode. The first controlled electrode of the delay balancer transistor 828 may be coupled to the first controlled electrode of the first pull-down transistor 818. The second controlled electrode of the delay balancer transistor 828 may be coupled to the second controlled electrode of the first pull-down transistor 818. The delay balancer inverter 830 may include a first electrode and a second electrode. The first electrode may be coupled to the second input electrode 810 and the second electrode may be coupled to the control electrode of the delay balancer transistor 828.

When the first input voltage switches from a first logic state (e.g. a "high" state) to a second logic state (e.g. a "low" state), the first pull-down transistor 818 may be turned off. The input inverter 826 causes a delay in switching the second input voltage from the second logic state (e.g. a "low" state) to the first logic state (e.g. a "high" state). The first pull-down transistor 818 may be switched off before the second pull-down transistor 822 is switched on. The transconductance may be reduced for switching and the fall delay may increase. When the first input voltage switches from a second logic state (e.g. a "low" state) to a first logic state (e.g. a "high" state), pull-down transistor 818 may be turned on. However, due to the delay caused by the input inverter 826, the second pull-down inverter 822 may be switched off after the first pull-down transistor is switched on. Transconductance may be high and rise delay may be small.

The delay balancer transistor may be coupled in parallel to the first pull-down transistor 818. The delay balancer inverter causes a delay in switching the voltage at the control electrode of the delay balancer transistor. When the first input voltage switches from a first logic state (e.g. a "high" state) to a second logic state (e.g. a "low" state), the first pull-down transistor 818 may be turned off before the second pull-down transistor 822 is switched on, but the delay balancer transistor in parallel to the first pull-down transistor 818 may remain turned on. The delay balancer transistor may improve transconductance and reduce fall delay. When the first input voltage switches from a second logic state (e.g. a "low" state) to a first logic state (e.g. a "high" state), the delay balancer transistor 828 and the first pull-down transistor 818 are switched on before the second pull-down transistor 822 is switched off. The delay transistor 828 is switched on before the second pull-down transistor 822 is switched off because of the delay balancer inverter 830. The overlapped on time may increase the short current, but switching energy may remain similar since delay is reduced.

The circuit arrangement may further include a subsequent level shifting stage cascaded to the level shifting stage 802. The subsequent level shifting stage may be coupled or be directly coupled to the first reference voltage 804 and the second reference voltage 814. The subsequent level shifting stage may include a third pull-down transistor 832, a third pull-up transistor 834, a fourth pull-down transistor 836 and a fourth pull-up transistor 838.

In various embodiments, the subsequent level shifting stage may include a third set of sequentially coupled pull-up and pull-down sub-circuits cross-coupled to a fourth set of sequentially coupled pulled-up and pull-down sub-circuits to generate a subsequent positive feedback loop.

The pull-up sub-circuit in the third set may include a third pull-up transistor 834. The pull-down sub-circuit in the third set may include a third pull-down transistor 832. In other words, the third set of sequentially coupled pull-up and pull-down sub-circuits may include the third pull-up transistor and the third pull-down transistor. The third pull-up transistor 834 may include a control electrode, a first controlled electrode and a second controlled electrode. The third pull-down transistor 832 may include a control electrode, a first controlled electrode and a second controlled electrode. The third pull-up transistor 834 may be sequentially coupled to the third pull-down transistor 832 by coupling the first controlled electrode of the third pull-up transistor 834 to the first controlled electrode of the third pulled-down transistor 832.

The pull-up sub-circuit in the fourth set may include a fourth pull-up transistor 838. The pull-down sub-circuit in the fourth set may include a fourth pull-down transistor 836. In other words, the fourth set of sequentially coupled pull-up and pull-down sub-circuits may include the fourth pull-up transistor 838 and the fourth pull-down transistor 836. The fourth pull-up transistor 838 may include a control electrode, a first controlled electrode and a second controlled electrode. The fourth pull-down transistor 836 may include a control electrode, a first controlled electrode and a second controlled electrode. The fourth pull-up transistor 838 may be sequentially coupled to the fourth pull-down transistor 836 by coupling the first controlled electrode of the fourth pull-up transistor 838 to the first controlled electrode of the fourth pulled-down transistor 836.

The third set of sequentially coupled pull-up and pull-down sub-circuits cross-coupled to the fourth set of sequentially coupled pull-up and pull-down sub-circuits may include coupling the first controlled electrode of the third pull-down transistor 832 to the control electrode of the fourth pull-up transistor 838. The third set of sequentially coupled pull-up and pull-down sub-circuits cross-coupled to the fourth set of sequentially coupled pull-up and pull-down sub-circuits may further include coupling the first controlled electrode of the fourth pull-down transistor 836 to the control electrode of the third pull-up transistor 834.

The subsequent level shifting stage cascaded to the level shifting stage may include coupling the first controlled electrode of the first pull-down transistor 818 to the control electrode of the third pull-down transistor 832. The subsequent level shifting stage cascaded to the level shifting stage may alternatively or additionally, include coupling the first controlled electrode of the second pull-down transistor 822 to the control electrode of the fourth pull-down transistor 836.

The subsequent shifting stage may further include a further output electrode 840. The output electrode 840 may be coupled to the first controlled electrode of the third pull-down transistor 832.

Advantageously, the subsequent level shifting stage coupled to the first reference voltage 804 and the second reference voltage 814 (without any intervening circuit elements) allows a voltage to be generated at the output electrode 840 ranging from the first reference voltage 804 to the second reference voltage 814. In various embodiments, the level shifting stage may be connected to the load 812 to weaken the pull-up path while the subsequent shifting stage may be directly connected to the first reference voltage 804 and the second reference voltage 814 (without any intervening circuit elements) to achieve full output voltage swing.

In various embodiments, the pull-down transistors 818, 822, 832, 836 may be configured according to minimum width finger sizing method for reducing threshold voltages to increase driving current. By applying the minimum width sizing method, the inverse narrow width effect (INWE) is utilized. Due to the inverse narrow width effect (INWE), the threshold voltages of the transistors are increased as the transistor width are increased from minimum, which may lead to reduced driving current. The circuit arrangement may include pull-down transistors 818, 822, 832, 836 having minimum width transistors for achieving the low threshold voltages and increase driving current for reducing delay, especially at low voltages. Additionally, the size of the pull-down transistors 818, 822, 832, 836 may be reduced (due to increased driving current), which may further reduce delay as well as power consumption.

The pull-down transistors 818, 822, 832, 836 may be configured according to minimum width finger sizing method. The pull-down transistors 818, 822, 832, 836 may be configured according to minimum width finger sizing method by folding each transistor into multiple folded transistors (also called "fingers") having an equivalent current drive as the transistor when connected properly in combination. Each of the folded transistors may have a reduced width. Configuring each transistor may further include sharing drain and/or source electrodes between the folded transistors.

In various embodiments, the pull-down transistors 818, 822, 832, 836 are n-channel metal oxide semiconductor field effect transistors (MOSFETs). In various embodiments, the pull-up transistors 820, 824, 834, 838 are p-channel metal oxide semiconductor field effect transistors (MOSFETs).

The second reference voltage 814 may include a voltage in the super-threshold region or a voltage in the near-threshold region or about-threshold region.

In various embodiments, the inverters 826, 830 may be powered by a third reference voltage (VDDL). In various embodiments, the third reference voltage may be lower than the second reference voltage (VDD). For instance, the third reference voltage may be at about 0.35V. The second reference voltage may be at about 1.2V.

FIG. 9 shows a schematic 900 of a method of operating a circuit arrangement according to various embodiments. The method may include, in 902, coupling a level shifting stage to a first reference voltage. The method may also include, in 904, coupling a first end of a load to the level shifting stage and a second end of the load to a second reference voltage. The method may additionally include, in 906, coupling a first end of a bypass circuit element to the level shifting stage and a second end of the bypass circuit element to a second reference voltage such that the circuit element is in parallel to the load. The method may further include, in 908, applying a first input voltage to a first input electrode in electrical connection with the level shifting stage, the first input voltage configured to switch between a first logic state and a second logic state. The method may also include, in 910, applying a second input voltage to a second input electrode in electrical connection with the level shifting stage, the second input voltage configured to switch between the second logic state and the first logic state. The level shifting stage may be configured to generate a first output voltage at an output node of the level shifting stage when the first input voltage is in the first logic state and the second input voltage is in the second logic state. The level shifting stage may be configured to generate a second output voltage at the output node when the first input voltage is in the second logic state and the second input voltage is in the first logic state. The method may further include, in 912, applying an external voltage to the bypass circuit element to allow current to flow through the circuit element for bypassing the load.

In various embodiments, the logic state of the second input voltage may different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The circuit arrangement may be configured such that when a first input voltage in the first logic state is applied to the first input electrode, a second input voltage in the second logic state is applied to the second input electrode. Conversely, the circuit arrangement may be configured such that when a first input voltage in the second logic state is applied to the first input electrode, a second input voltage in the first logic state is applied to the second input electrode.

The method may further include coupling an input inverter to the level shifting stage. The input inverter may have a first electrode and a second electrode. Coupling the input inverter to the level shifting stage may include coupling the first electrode to the first input electrode and coupling the second electrode to the second input electrode. The input inverter may invert the logic state of the first input voltage applied to the first input electrode and generates the second input voltage in a logic state different from the logic state of the first input voltage. For example, when a high voltage is applied to the first input electrode, the input inverter produces a low voltage at the second electrode (of the input inverter) and applies the low voltage to the second input electrode. Conversely, when a low voltage is applied to the first input electrode, the input inverter produces a high voltage at the second electrode (of the input inverter) and applies the high voltage to the second input electrode.

In various embodiments, the first output voltage may represent the first logic state and the second output voltage may represent the second logic state.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state.

The voltage of the first input voltage in the first logic state may be substantially equal to the voltage of the second input voltage in the first logic state. The voltage of the first input voltage in the second logic state may be substantially equal to the voltage of the second input voltage in the second logic state.

The first output voltage may be substantially equal or below the second reference voltage. For instance, the first output voltage may be substantially equal to the second reference voltage subtracted by the voltage drop across the load when the bypass circuit is deactivated. The first output voltage may be substantially equal to the second reference voltage when the bypass circuit is activated.

The level shifting stage shifts the first input voltage (in a first logic state) to a higher voltage (first output voltage representing a first logic state). For instance, a first input voltage of about 1V (representing high state) may be applied to the first input electrode. The input inverter may generate a second input voltage (representing low state) to the second input electrode. The level shifting stage may be coupled to a second reference voltage (i.e. supply voltage) of about 5V. The level shifting stage may generate a first output voltage high state at the output node (when a first input voltage representing high state is applied to the first input electrode and when a second input voltage representing low state is applied to the second input electrode). The first output voltage may be substantially about 5V when the bypass circuit is activated. The first output voltage may be substantially about 4V when the bypass circuit is deactivated. The level shifting stage may be configured to "shift" an input voltage of a lower magnitude (e.g. about 1V) to an output voltage of a higher magnitude (e.g. about 4V or about 5V).

The first reference voltage may be at ground (about 0V). A first input voltage of about 0V (representing low state) may be applied to the first input electrode. The input inverter may generate a second input voltage (representing high state) to the second input electrode. The level shifting stage may generate a second output voltage substantially equal to ground (representing low state) at the output node (when a first input voltage representing low state is applied to the first input electrode and when a second input voltage representing high state is applied to the second input electrode). The second output voltage may be substantially equal to ground when the bypass circuit is activated or when the bypass circuit is deactivated.

The load may cause propagation delay to not track voltage scaling well, especially when the supply voltage (i.e. the second reference voltage) is raised to the super-threshold region because of the nearly constant voltage drop across the load. The load may result in degraded performance of the circuit arrangement when operating in the super-threshold region and may make the circuit arrangement to be unsuitable for dynamic voltage scaling (DVS) applications.

Coupling a first end of the bypass circuit element to the level shifting stage and a second end of the bypass circuit element to the second reference voltage such that the bypass circuit element is in parallel to the load may at least partially improve performance of the circuit arrangement and allow for faster operation.

The bypass circuit element may allow the circuit arrangement to be used for supply voltages in the around threshold and the super threshold regions to be used. When the supply voltage is at around-threshold region, the bypass circuit element may be disabled to weaken the pull-up path in the level shifting stage. When the supply voltage is at super-threshold region, the voltage drop across the load may remain fairly constant, which may in turn lead to propagation delays. The bypass circuit element may be configured to allow current to flow through (i.e. activated) upon application of an external voltage for bypassing the load. The method may further include applying the external voltage to the bypass circuit element when the supply voltage (i.e. second reference voltage) exceeds a predetermined level, such as the threshold voltage. The method may include coupling a comparator circuit with the second reference voltage and the bypass circuit element. The comparator circuit may be configured to compare the second reference voltage and a voltage fixed at the predetermined level and generates the external voltage when the second reference voltage is equal or exceeds the voltage at the predetermined level. The bypass circuit element may at least partially improve performance of the circuit arrangement and allow for faster operation when the supply voltage (i.e. second reference voltage) is at around-threshold region.

In various embodiments, the level shifting stage may include a first set of sequentially coupled pull-up and pull-down sub-circuits cross-coupled to a second set of sequentially coupled pulled-up and pull-down sub-circuits to generate a positive feedback loop.

The pull-up sub-circuit in the first set may include a first pull-up transistor. The pull-down sub-circuit in the first set may include a first pull-down transistor. In other words, the first set of sequentially coupled pull-up and pull-down sub-circuits may include the first pull-up transistor and the first pull-down transistor. The first pull-up transistor may include a control electrode, a first controlled electrode and a second controlled electrode. The first pull-down transistor may include a control electrode, a first controlled electrode and a second controlled electrode. The first pull-up transistor may be sequentially coupled to the first pull-down transistor by coupling the first controlled electrode of the first pull-up transistor to the first controlled electrode of the first pulled-down transistor.

The pull-up sub-circuit in the second set may include a second pull-up transistor. The pull-down sub-circuit in the second set may include a second pull-down transistor. In other words, the second set of sequentially coupled pull-up and pull-down sub-circuits may include the second pull-up transistor and the second pull-down transistor. The second pull-up transistor may include a control electrode, a first controlled electrode and a second controlled electrode. The second pull-down transistor may include a control electrode, a first controlled electrode and a second controlled electrode. The second pull-up transistor may be sequentially coupled to the second pull-down transistor by coupling the first controlled electrode of the second pull-up transistor to the first controlled electrode of the second pulled-down transistor.

The first set of sequentially coupled pull-up and pull-down sub-circuits cross-coupled to the second set of sequentially coupled pull-up and pull-down sub-circuits may include coupling the first controlled electrode of the first pull-down transistor to the control electrode of the second pull-up transistor. The first set of sequentially coupled pull-up and pull-down sub-circuits cross-coupled to the second set of sequentially coupled pull-up and pull-down sub-circuits may further include coupling the first controlled electrode of the second pull-down transistor to the control electrode of the first pull-up transistor.

In various embodiments, the method may include cross-coupling the first set of sequentially coupled pull-up and pull-down sub-circuits with the second set of sequentially coupled pull-up and pull-down sub-circuits to generate a positive feedback loop.

In various embodiments, the method may include coupling the first controlled electrode of the first pull-up transistor to the first controlled electrode of the first pull-down transistor. The method may also include coupling the first controlled electrode of the second pull-up transistor to the first controlled electrode of the second pull-down transistor.

The method may further include coupling the first controlled electrode of the first pull-down transistor to the control electrode of the second pull up transistor. The method may additionally include coupling the first controlled electrode of the second pull-down transistor to the control electrode of the first pull-up transistor.

Coupling the first end of the load to the level shifting stage may include coupling the first end of the load to the second controlled electrode of the first pull-up transistor and/or the second controlled electrode of the second pull-up transistor. Coupling the first end of the bypass circuit element to the level shifting stage may include coupling the first end of the bypass circuit element to the second controlled electrode of the first pull-up transistor and/or the second controlled electrode of the second pull-up transistor.

Coupling the level shifting stage to the first reference voltage may include coupling the second controlled electrode of the first pull-down transistor and/or the second controlled electrode of the second pull-down transistor to the first reference voltage.

The load may include a diode or a transistor. The circuit arrangement may be configured such that the diode is forward-biased. The transistor (which may also be called a load transistor) may have a control electrode and a first controlled electrode and a second controlled electrode. The transistor (load transistor) may be configured as a diode, e.g. by connecting the first controlled electrode of the transistor (load transistor) to the control electrode of the transistor (load transistor). The first controlled electrode of the transistor (load transistor) may be coupled to the second reference voltage. The second controlled electrode of the transistor (load transistor) may be coupled to the level shifting stage. In other words, the second end of the load may include the second controlled electrode of the transistor (load transistor). The first end of the load may include the first controlled electrode of the transistor (load transistor). The transistor (load transistor) may be a NMOS transistor.

The bypass circuit element may include a bypass transistor. The bypass transistor may include a control electrode and a first controlled electrode and a second controlled electrode. The first controlled electrode of the bypass transistor may be coupled to the second reference voltage. The second controlled electrode of the bypass transistor may be coupled to the level shifting stage. The second controlled electrode of the bypass transistor may also be coupled to the load. In other words, the first end of the bypass circuit element may include the second controlled electrode of the bypass transistor. The second end of the bypass circuit element may include the first controlled electrode of the bypass transistor. The bypass transistor may include a PMOS transistor.

The bypass circuit element may instead include any sub-circuit arrangement that allows current to flow through for bypassing the load upon application of an external voltage. The external voltage may be a low signal or a high signal.

The bypass circuit element may instead be configured such that current flows through the bypass circuit element upon termination of an external voltage. In other words, the external voltage prevents current from flowing through the circuit element. When the external voltage is terminated, current flows through the circuit element for bypassing the load.

The method may further include coupling a delay balancer sub-circuit in parallel to the first pull-down transistor. The method may alternatively include coupling the delay balancer sub-circuit in parallel to the second pull-down transistor.

The delay balancer sub-circuit may include a delay balancer transistor. The delay balancer sub-circuit may further include a delay balancer inverter. The delay balancer transistor may include a control electrode, a first controlled electrode and a second controlled electrode. The method may include coupling the first controlled electrode of the delay balancer transistor to the first controlled electrode of the first pull-down transistor. The method may also include coupling the second controlled electrode of the delay balancer transistor to the second controlled electrode of the first pull-down transistor. The delay balancer inverter may include a first electrode and a second electrode. The method may also include coupling the first electrode of the delay balancer inverter to the second input electrode and the second electrode to the control electrode of the delay balancer transistor.

The method may include cascading a subsequent level shifting stage to the level shifting stage. The method may include coupling or directly coupling the subsequent level shifting stage to the first reference voltage and the second reference voltage. In various embodiments, the level shifting stage may be connected to the load to weaken the pull-up path while the subsequent shifting stage may be directly connected to the first reference voltage and the second reference voltage (without any intervening circuit elements) to achieve full output voltage swing.

In various embodiments, the subsequent level shifting stage may include a third set of sequentially coupled pull-up and pull-down sub-circuits cross-coupled to a fourth set of sequentially coupled pulled-up and pull-down sub-circuits to generate a subsequent positive feedback loop.

The pull-up sub-circuit in the third set may include a third pull-up transistor. The pull-down sub-circuit in the third set may include a third pull-down transistor. In other words, the third set of sequentially coupled pull-up and pull-down sub-circuits may include the third pull-up transistor and the third pull-down transistor. The third pull-up transistor may include a control electrode, a first controlled electrode and a second controlled electrode. The third pull-down transistor may include a control electrode, a first controlled electrode and a second controlled electrode. The third pull-up transistor may be sequentially coupled to the third pull-down transistor by coupling the first controlled electrode of the third pull-up transistor to the first controlled electrode of the third pulled-down transistor.

The pull-up sub-circuit in the fourth set may include a fourth pull-up transistor. The pull-down sub-circuit in the fourth set may include a fourth pull-down transistor. In other words, the fourth set of sequentially coupled pull-up and pull-down sub-circuits may include the fourth pull-up transistor and the fourth pull-down transistor. The fourth pull-up transistor may include a control electrode, a first controlled electrode and a second controlled electrode. The fourth pull-down transistor may include a control electrode, a first controlled electrode and a second controlled electrode. The fourth pull-up transistor may be sequentially coupled to the fourth pull-down transistor by coupling the first controlled electrode of the fourth pull-up transistor to the first controlled electrode of the fourth pulled-down transistor.

The third set of sequentially coupled pull-up and pull-down sub-circuits cross-coupled to the fourth set of sequentially coupled pull-up and pull-down sub-circuits may include coupling the first controlled electrode of the third pull-down transistor to the control electrode of the fourth pull-up transistor. The third set of sequentially coupled pull-up and pull-down sub-circuits cross-coupled to the fourth set of sequentially coupled pull-up and pull-down sub-circuits may further include coupling the first controlled electrode of the fourth pull-down transistor to the control electrode of the third pull-up transistor.

In various embodiments, the method may include cross-coupling the third set of sequentially coupled pull-up and pull-down sub-circuits with the fourth set of sequentially coupled pull-up and pull-down sub-circuits to generate a subsequent positive feedback loop.

In various embodiments, the method may include coupling the first controlled electrode of the third pull-up transistor to the first controlled electrode of the third pull-down transistor. The method may also include coupling the first controlled electrode of the fourth pull-up transistor to the first controlled electrode of the fourth pull-down transistor.

The method may further include coupling the first controlled electrode of the third pull-down transistor to the control electrode of the fourth pull up transistor. The method may additionally include coupling the first controlled electrode of the fourth pull-down transistor to the control electrode of the third pull-up transistor.

Cascading a subsequent level shifting stage to the level shifting stage may include coupling the first controlled electrode of the first pull-down transistor to the control electrode of the third pull-down transistor. The subsequent level shifting stage cascaded to the level shifting stage may alternatively or additionally, include coupling the first controlled electrode of the second pull-down transistor to the control electrode of the fourth pull-down transistor.

The subsequent shifting stage may further include a further output electrode. The method may include coupling the output electrode to the first controlled electrode of the third pull-down transistor.

Advantageously, the subsequent level shifting stage coupled to the first reference voltage and the second reference voltage allows a voltage to be generated at the output electrode ranging from the first reference voltage to the second reference voltage.

In various embodiments, the pull-down transistors may be configured according to minimum width finger sizing method for reducing threshold voltages to increase driving current. The method may include configuring the pull-down transistors according to minimum width finger sizing method. By applying the minimum width sizing method, the inverse narrow width effect (INWE) is utilized. Due to the inverse narrow width effect (INWE), the threshold voltages of the transistors are increased as the transistor width are increased from minimum, which may lead to reduced driving current. The method may include coupling or using pull-down transistors having minimum width transistors for achieving the low threshold voltages and increasing driving current for reducing delay, especially at low voltages. Additionally, the size of the pull-down transistors may be reduced (due to increased driving current), which may further reduce delay as well as power consumption.

The pull-down transistors may be configured according to minimum width finger sizing method. The pull-down transistors may be configured according to minimum width finger sizing method by folding each transistor into multiple folded transistors (also called "fingers") having an equivalent current drive as the transistor when connected properly in combination. Each of the folded transistors may have a reduced width. Configuring each transistor may further include sharing drain and/or source electrodes between the folded transistors.

In various embodiments, the pull-down transistors are n-channel metal oxide semiconductor field effect transistors (MOSFETs). In various embodiments, the pull-up transistors are p-channel metal oxide semiconductor field effect transistors (MOSFETs).

Figure 10A:
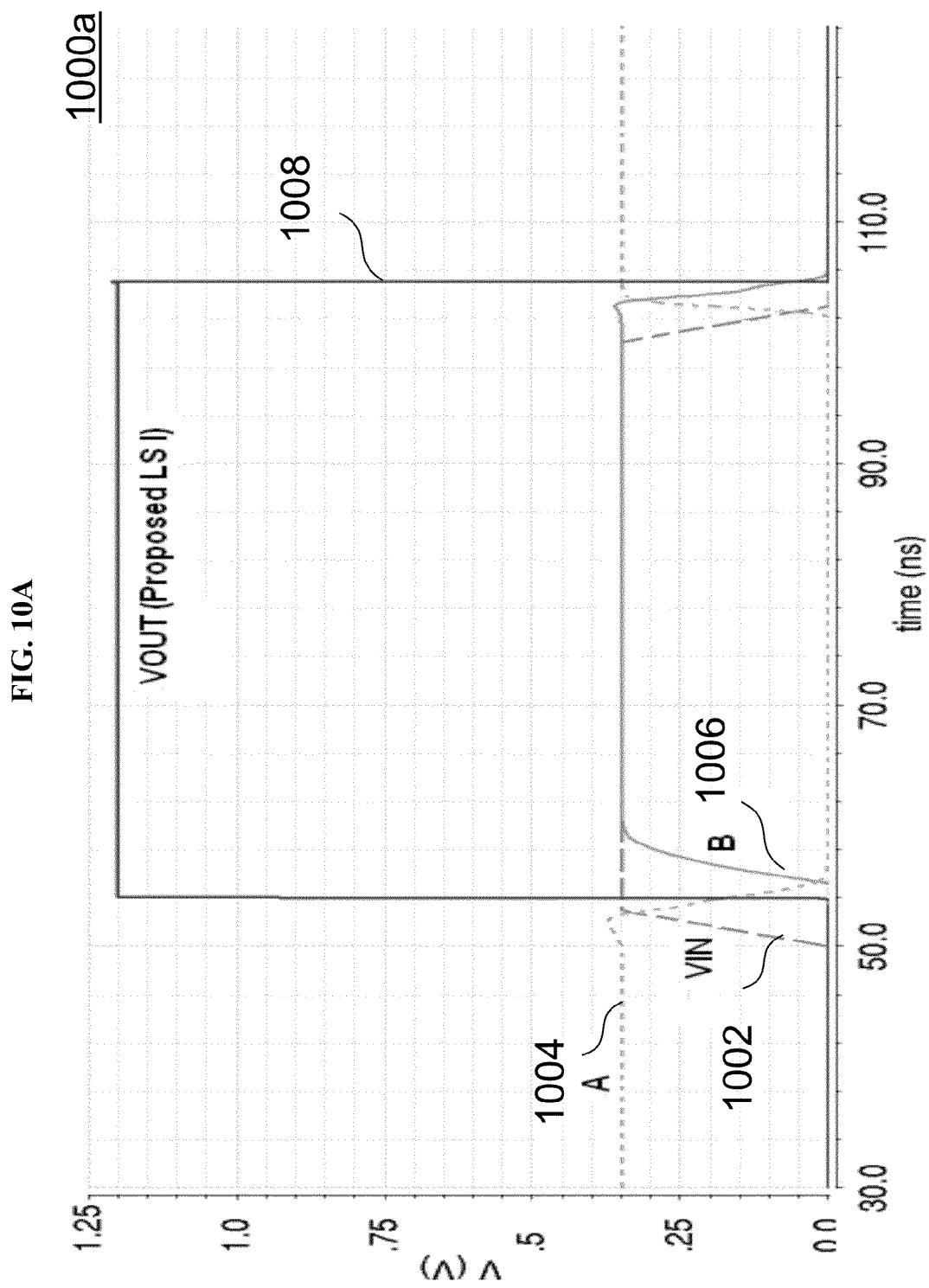
FIG. 10A is a graph of voltage as a function of time showing the transient behaviour at different nodes of the circuit arrangement according to various embodiments.

FIG. 10A is a graph 1000a of voltage as a function of time showing the transient behaviour at different nodes of the circuit arrangement according to various embodiments The graph is simulated using a 65 nm CMOS process technology and the threshold voltage is set at 0.4V. The input rise and fall transient time are set at 3 ns which is equal to the fan out of 4 (FO4) delay at 0.35 V. The output load capacitance is set to 100 fF. The third reference voltage (VDDL) is set at 0.35 V and the second reference voltage (VDD) is set at 1.2 V. Line 1002 indicates the first input voltage at the first input electrode. Line 1004 indicates the second input voltage at the second input electrode. Line 1006 indicates the voltage at the control electrode of the delay balancer transistor. Line 1008 indicates the output voltage at the output electrode. The output voltage may include the first output voltage (about 1.2 V) and the second output voltage (about 0 V). It may be seen from FIG. 10A that the circuit arrangement may be able to 'shift' a lower first input voltage to a higher first output voltage within 3 ns. The overlapped 'high" states at the first input electrode (or the control electrode) and at the second input electrode may lead to increased transconductance for both rise and fall transitions. The fall and rise transition may be close to symmetry.

Figure 10B:
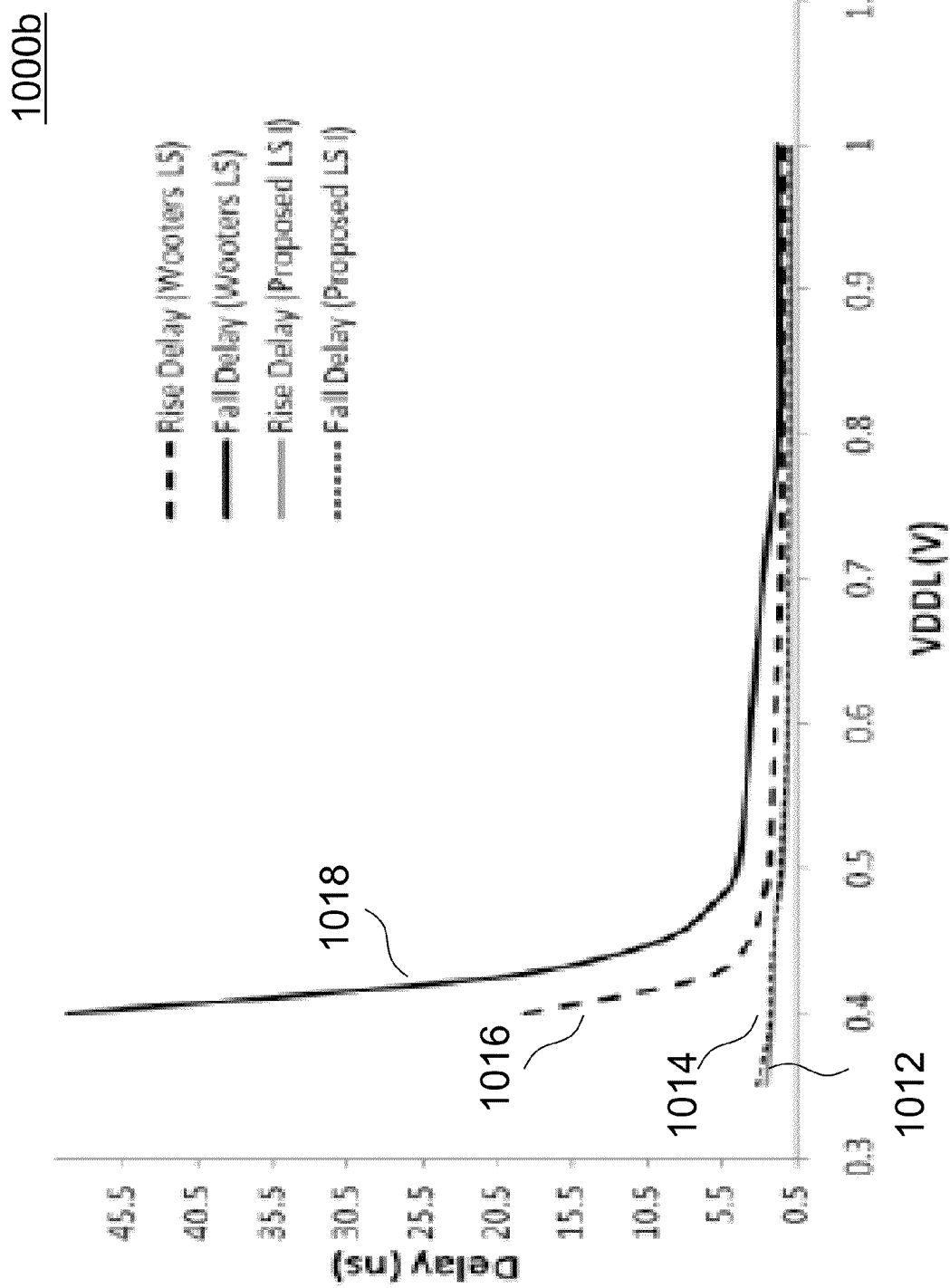
FIG. 10B is a graph of delay against the third reference voltage (VDDL)

FIG. 10B is a graph 1000b of delay against the third reference voltage (VDDL). Lines 1012 and 1014 indicate the rise delay and fall delay respectively for the circuit arrangement according to various embodiments. Lines 1016 and 1018 indicate the rise delay and the fall delay respectively for a conventional level shifter. The circuit arrangement according to various embodiments have smaller and more symmetric rise and fall delays compared to the conventional level shifter across all VDDLs from 0.35 V to 1 V. At 0.35 V, the average delay of the circuit arrangement according to various embodiments is around 2.8 ns while the conventional level shifter fails to operate below 0.4 V (for fair comparison the conventional level shifter is sized to have a similar area as that of the circuit arrangement according to various embodiments). At 0.4 V, the circuit arrangement according to various embodiments has a average delay of about 2.5 ns and is about 12 times faster than the conventional level shifter (which is about 30 ns).

Figure 11:
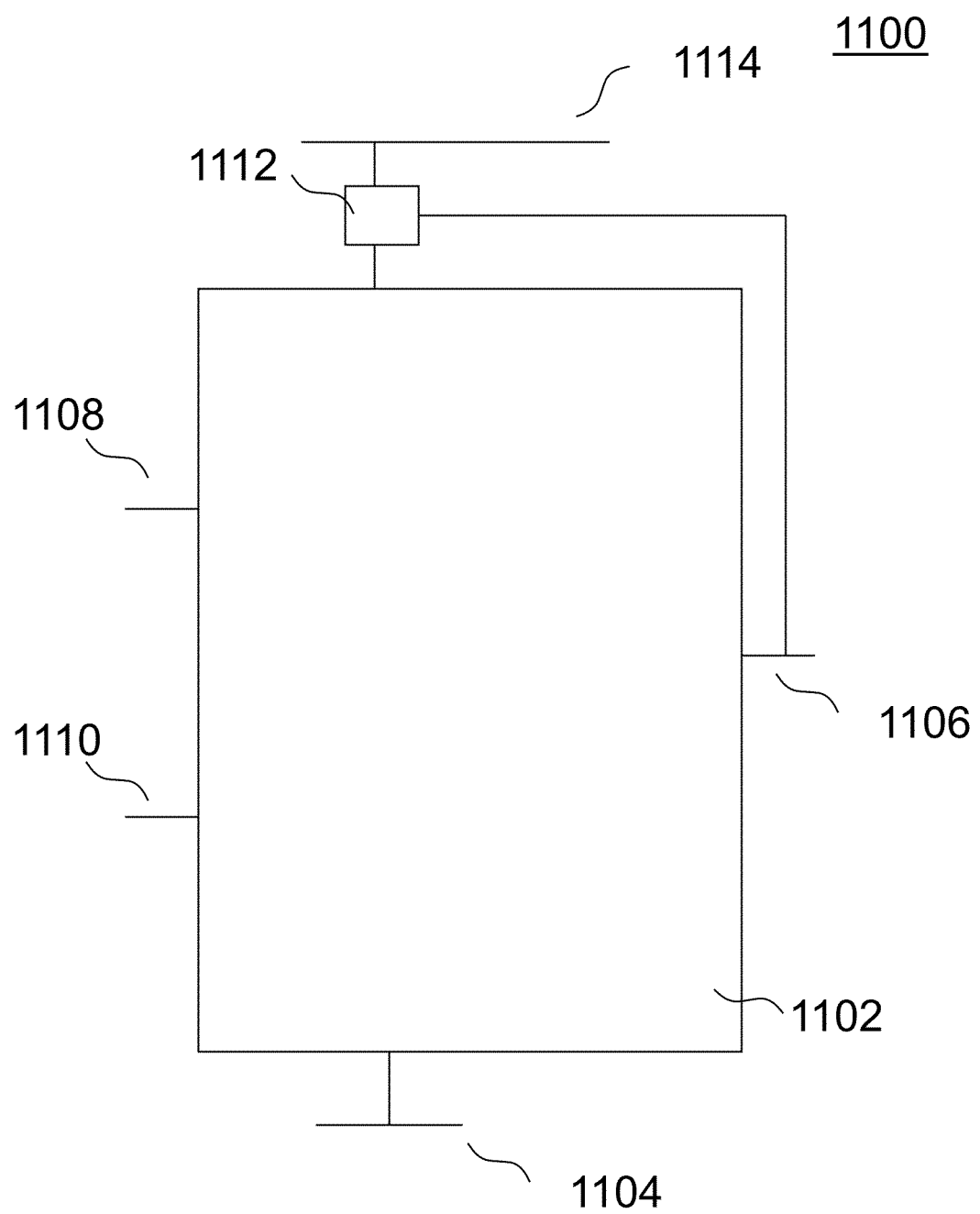
FIG. 11 shows a schematic of a circuit arrangement according to various embodiments.

FIG. 11 shows a schematic 1100 of a circuit arrangement according to various embodiments. The circuit arrangement may include a level shifting stage 1102 coupled to a first reference voltage 1104. The circuit arrangement may further include a first input electrode 1108 in electrical connection with the level shifting stage 1102 for coupling a first input voltage. The circuit arrangement may also include a second input electrode 1110 in electrical connection with the level shifting stage 1102 for coupling a second input voltage. The circuit arrangement may additionally include an output electrode 1106 in electrical connection with the level shifting stage 1102 for providing one of a first output voltage and a second output voltage. The circuit arrangement may further include a feedback circuit 1112 coupled with the level shifting stage 1102, the output electrode 1106 and a second reference voltage 1114. The first input voltage may be configured to switch between a first logic state and a second logic state. The second input voltage may be configured to switch between the second logic state and the first logic state. The level shifting stage 1102 may be configured to generate the first output voltage when the first input voltage is in the first logic state and the second input voltage is in the second logic state. The level shifting stage 1102 may be configured to generate the second output voltage when the first input voltage is in the second logic state and the second input voltage is in the first logic state. The feedback circuit 1112 may be configured to maintain the first output voltage at the output electrode 1106 above a predetermined level when the first input voltage is in the first logic state and the second input voltage is in the second logic state.

In other words, the circuit arrangement may include a level shifting stage 1102 coupled to a first reference voltage 1104. The level shifting stage 1102 may be connected to a first input electrode 1108 and a second input electrode 1110. A first input voltage may be applied to the first input electrode 1108 and a second input voltage may be applied to the second input electrode 1110. The first input voltage may have voltages representing a first logic state and a second logic state. Similarly, the second input voltage may have voltages representing a first logic state and a second logic state. When a first input voltage representing a first logic state is applied to the first input electrode 1108, a second input voltage representing a second logic state may be applied to the second input electrode 1110. Conversely, when a first input voltage representing the second logic state is applied to the first input electrode 1108, a second input voltage representing the first logic state may be applied to the second input electrode 1110. The level shifting stage 1102 may further include an output electrode 1106. The level shifting stage 1102 may be configured to generate a first output voltage at the output node 1106 when the first input voltage representing the first logic state is applied to the first input electrode 1108 and the second input voltage representing the second logic state is applied to the second input electrode 1110. Conversely, the level shifting stage 1102 may be configured to generate a second output voltage at the output node 1106 when the first input voltage representing the second logic state is applied to the first input electrode 1108 and the second input voltage representing the first logic state is applied to the second input electrode 1110. The circuit arrangement may further include a feedback circuit 1112. The feedback circuit 1106 may be coupled between the output electrode 1106 and the level shifting stage 1102. The feedback circuit 1112 may be configured to maintain the first output voltage at the output electrode 1106 above a predetermined level when the first input voltage is in the first logic state and the second input voltage is in the second logic state. The feedback circuit may be further coupled to a second reference voltage 1114.

In various embodiments, the logic state of the second input voltage may be different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The circuit arrangement may be configured such that when a first input voltage in the first logic state is applied to the first input electrode 1108, a second input voltage in the second logic state is applied to the second input electrode 1110. Conversely, the circuit arrangement may be configured such that when a first input voltage in the second logic state is applied to the first input electrode 1108, a second input voltage in the first logic state is applied to the second input electrode 1110. The circuit arrangement may further include an input inverter having an first electrode and a second electrode. The first electrode may be coupled to the first input electrode 1108 and the second electrode may be coupled to the second input electrode 1110. The input inverter may invert the logic state of the first input voltage applied to the first input electrode 1108 and generates the second input voltage in a logic state different from the logic state of the first input voltage. For example, when a high voltage is applied to the first input electrode 1108, the input inverter produces a low voltage at the second electrode (of the input inverter) and applies the low voltage to the second input electrode 1110. Conversely, when a low voltage is applied to the first input electrode 1108, the input inverter produces a high voltage at the second electrode (of the input inverter) and applies the high voltage to the second input electrode 1110.

In various embodiments, the first output voltage may represent the first logic state and the second output voltage may represent the second logic state.

The circuit arrangement may be a level shifter or may be a part of a level shifter.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state. In other words, the first input voltage at both the first logic state and the second logic state is below the first output voltage.

In various embodiments, the feedback circuit 1112 may be configured to maintain the first output voltage at the output electrode 1106 above a predetermined level includes the feedback circuit 1112 configured to maintain the first output voltage at a substantially constant level.

In various embodiments, the predetermined level may be more than 80%, e.g. more than 90%, e.g. more than 95%, e.g. more than 99% of the second reference voltage.

In various embodiments, the level shifting stage 1102 may include a current mirror.

In various embodiments, the current mirror may include a first set of sequentially coupled pull-up and pull-down sub-circuits. The current mirror may further include a second set of sequentially coupled pull-up and pull-down sub-circuits. The second set of sequentially coupled pull-up and pull-down sub-circuits may be coupled to the first set of sequentially coupled pull-up and pull-down sub-circuits to form the current mirror.

The pull-up sub-circuit in the first set may include a first pull-up transistor. The pull-down sub-circuit in the first set may include a first pull-down transistor. In other words, the first set of sequentially coupled pull-up and pull-down sub-circuits may include the first pull-up transistor and the first pull-down transistor. The first pull-up transistor may have a control electrode, a first controlled electrode and a second controlled electrode. The first pull-down transistor may have a control electrode, a first controlled electrode and a second controlled electrode. The first controlled electrode of the first pull-down transistor may be coupled to the first controlled electrode of the first pull-up transistor.

The pull-up sub-circuit in the second set may include a second pull-up transistor. The pull-down sub-circuit in the second set may include a second pull-down transistor. The pull-up sub-circuit in the second set may further include a current limiter sub-circuit having a first end and a second end. In other words, the second set of sequentially coupled pull-up and pull-down sub-circuits may include the second pull-up transistor, the second pull-down transistor and the current limiter sub-circuit. The second pull-up transistor may include a control electrode, a first controlled electrode and a second controlled electrode. The second pull-down transistor may include a control electrode, a first controlled electrode and a second controlled electrode. The first controlled electrode of the second pull-down transistor may be coupled to the first end of the current limiter sub-circuit and the first controlled electrode of the second pull-up transistor may be coupled to the second end of the current limiter sub-circuit.

In various alternate embodiments, the second set of sequentially coupled pull-up and pull-down sub-circuits may include the second pull-up transistor and the second pull-down transistor. The first controlled electrode of the second pull-down transistor may be coupled to the first controlled electrode of the second pull-up transistor.

The current limiter sub-circuit may include a current limiter transistor. The current limiter transistor may have a control electrode, a first controlled electrode and a second controlled electrode. The first end of the current limiter sub-circuit may include the first controlled electrode of the current limiter transistor. The second end of the current limiter sub-circuit may include the second controlled electrode of the current limiter transistor. The control electrode of the current limiter transistor may be coupled to the second input electrode 1110. The current limiter transistor may be a PMOS transistor.

In various embodiments, the second set of sequentially coupled pull-up and pull-down sub-circuits coupled to the first set of sequentially coupled pull-up and pull-down sub-circuits to form the current mirror may include the control electrode of the first pull-up transistor coupled to the control electrode of the second pull-up transistor. The control electrode of the first pull-up transistor may be further coupled to the first controlled electrode of the first pull-up transistor to form the current mirror.

In other words, the current mirror may include the first set of sequentially coupled pull-up and pull-down sub-circuits and the second set of sequentially coupled pull-up and pull-down sub-circuits. The first set of sequentially coupled pull-up and pull-down sub-circuits may include at least a first pull-up transistor and a first pull-down transistor. The second set of sequentially coupled pull-up and pull-down sub-circuits may include at least a second pull-up transistor and a second pull-down transistor. The controlled electrode of the first pull-up transistor may be coupled to both the control electrode of the first pull-up transistor and the control electrode of the second pull-up transistor for forming the current mirror.

The current limiter sub-circuit may be configured to reduce current flowing through the second pull-up transistor when the output electrode is at the second output voltage.

In various embodiments, the feedback circuit 1112 may include a feedback transistor. The feedback transistor 1112 may include a control electrode, a first controlled electrode and a second controlled electrode.

The first controlled electrode of the feedback transistor may be coupled to the level shifting stage 1102. The second controlled electrode of the feedback transistor may be further coupled to the second reference voltage 1114. The control electrode of the feedback transistor may be coupled to the output electrode 1106.

In various embodiments, the pull-down transistors may be n-channel metal oxide semiconductor field effect transistors (MOSFETs). In various embodiments, the pull-up transistors may be p-channel metal oxide semiconductor field effect transistors (MOSFETs).

In various embodiments, the first reference voltage may be at ground.

Figure 12:
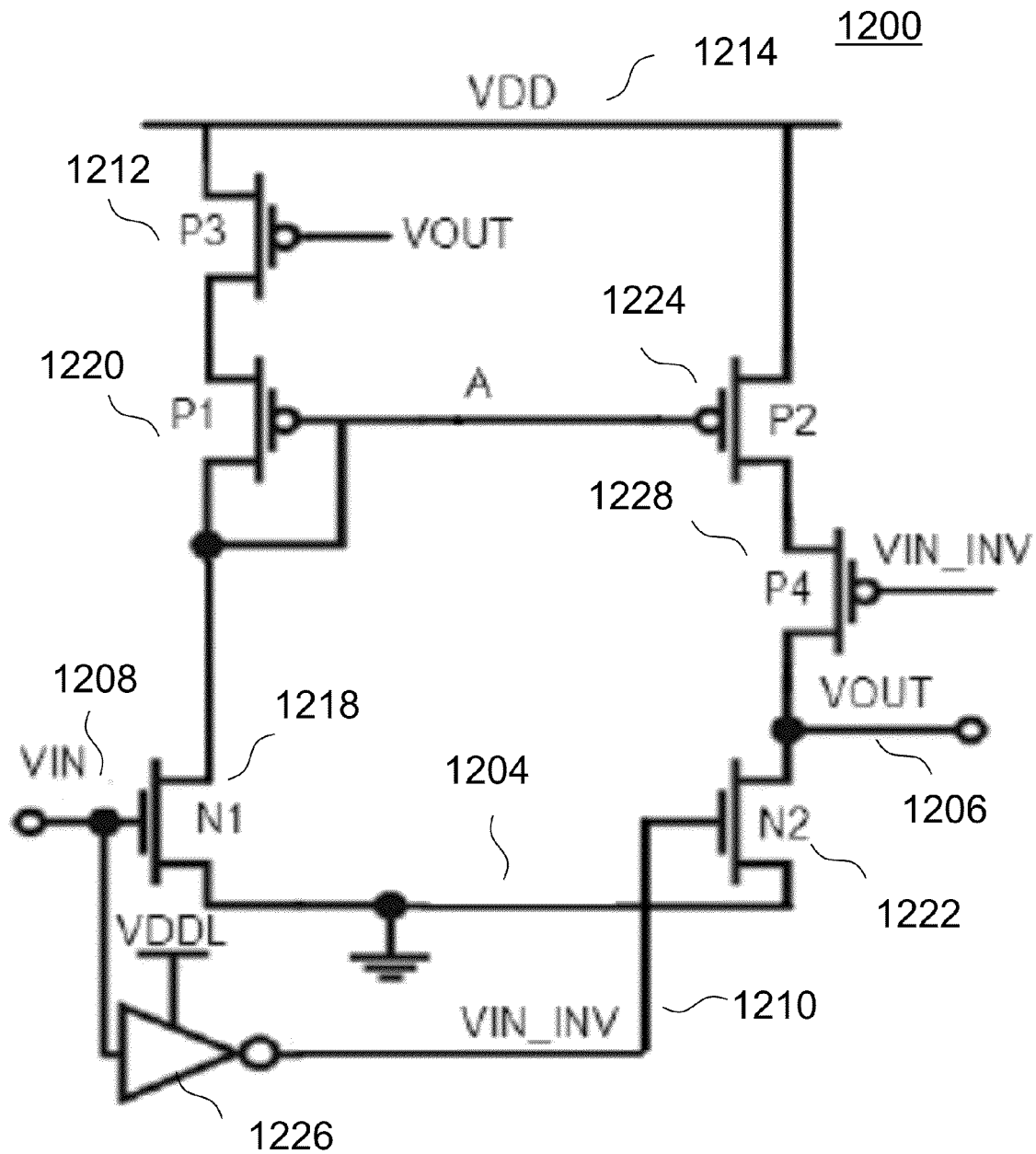
FIG. 12 shows a schematic of a circuit arrangement according to various embodiments.

FIG. 12 shows a schematic 1200 of a circuit arrangement according to various embodiments. The circuit arrangement may include a level shifting stage coupled to a first reference voltage 1204. The circuit arrangement may further include a first input electrode 1208 in electrical connection with the level shifting stage for coupling a first input voltage. The circuit arrangement may also include a second input electrode 1210 in electrical connection with the level shifting stage for coupling a second input voltage. The circuit arrangement may additionally include an output electrode 1206 in electrical connection with the level shifting stage for providing one of a first output voltage and a second output voltage. The circuit arrangement may further include a feedback circuit 1212 coupled with the level shifting stage, the output electrode 1206 and a second reference voltage 1214. The first input voltage may be configured to switch between a first logic state and a second logic state. The second input voltage may be configured to switch between the second logic state and the first logic state. The level shifting stage may be configured to generate the first output voltage when the first input voltage is in the first logic state and the second input voltage is in the second logic state. The level shifting stage may be configured to generate the second output voltage when the first input voltage is in the second logic state and the second input voltage is in the first logic state. The feedback circuit 1212 may be configured to maintain the first output voltage at the output electrode 1206 above a predetermined level when the first input voltage is in the first logic state and the second input voltage is in the second logic state.

In other words, the circuit arrangement may include a level shifting stage 1202 coupled to a first reference voltage 1204.

The level shifting stage 1202 may be connected to a first input electrode 1208 and a second input electrode 1210. A first input voltage may be applied to the first input electrode 1208 and a second input voltage may be applied to the second input electrode 1210. The first input voltage may have voltages representing a first logic state and a second logic state. Similarly, the second input voltage may have voltages representing a first logic state and a second logic state. When a first input voltage representing a first logic state is applied to the first input electrode 1208, a second input voltage representing a second logic state may be applied to the second input electrode 1210. Conversely, when a first input voltage representing the second logic state is applied to the first input electrode 1208, a second input voltage representing the first logic state may be applied to the second input electrode 1210. The level shifting stage 1202 may further include an output electrode 1206. The level shifting stage 1202 may be configured to generate a first output voltage at the output node 1206 when the first input voltage representing the first logic state is applied to the first input electrode 1208 and the second input voltage representing the second logic state is applied to the second input electrode 1210. Conversely, the level shifting stage 1202 may be configured to generate a second output voltage at the output node 1206 when the first input voltage representing the second logic state is applied to the first input electrode 1208 and the second input voltage representing the first logic state is applied to the second input electrode 1210. The circuit arrangement may further include a feedback circuit 1212. The feedback circuit 1206 may be coupled between the output electrode 1206 and the level shifting stage 1202. The feedback circuit 1212 may be configured to maintain the first output voltage at the output electrode 1206 above a predetermined level when the first input voltage is in the first logic state and the second input voltage is in the second logic state. The feedback circuit may be further coupled to a second reference voltage 1214.

In various embodiments, the logic state of the second input voltage may different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The circuit arrangement may be configured such that when a first input voltage in the first logic state is applied to the first input electrode 1208, a second input voltage in the second logic state is applied to the second input electrode 1210. Conversely, the circuit arrangement may be configured such that when a first input voltage in the second logic state is applied to the first input electrode 1208, a second input voltage in the first logic state is applied to the second input electrode 1210. The circuit arrangement may further include an input inverter 1226 having an first electrode and a second electrode. The first electrode may be coupled to the first input electrode 1208 and the second electrode may be coupled to the second input electrode 1210. The input inverter 1226 may invert the logic state of the input first voltage applied to the first input electrode 1208 and generates the second input voltage in a logic state different from the logic state of the first input voltage. For example, when a high voltage is applied to the first input electrode 1208, the input inverter produces a low voltage at the second electrode (of the input inverter) and applies the low voltage to the second input electrode 1210. Conversely, when a low voltage is applied to the first input electrode 1208, the input inverter produces a high voltage at the second electrode (of the input inverter) and applies the high voltage to the second input electrode 1210.

In various embodiments, the first output voltage may represent the first logic state and the second output voltage may represent the second logic state.

The circuit arrangement may be a level shifter or may be a part of a level shifter.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state. In other words, the first input voltage at both the first logic state and the second logic state may be below the first output voltage.

In various embodiments, the feedback circuit 1212 may be configured to maintain the first output voltage at the output electrode 1206 above a predetermined level includes the feedback circuit 1212 configured to maintain the first output voltage at a substantially constant level.

In various embodiments, the predetermined level may be more than 80%, e.g. more than 90%, e.g. more than 95%, e.g. more than 99% of the second reference voltage.

In various embodiments, the level shifting stage 1202 may include a current mirror.

In various embodiments, the current mirror may include a first set of sequentially coupled pull-up and pull-down sub-circuits. The current mirror may further include a second set of sequentially coupled pull-up and pull-down sub-circuits. The second set of sequentially coupled pull-up and pull-down sub-circuits may be coupled to the first set of sequentially coupled pull-up and pull-down sub-circuits to form the current mirror.

The pull-up sub-circuit in the first set may include a first pull-up transistor 1220. The pull-down sub-circuit in the first set may include a first pull-down transistor 1218. In other words, the first set of sequentially coupled pull-up and pull-down sub-circuits may include the first pull-up transistor 1220 and the first pull-down transistor 1218. The first pull-up transistor 1220 may have a control electrode, a first controlled electrode and a second controlled electrode. The first pull-down transistor 1218 may have a control electrode, a first controlled electrode and a second controlled electrode. The first controlled electrode of the first pull-down transistor 1218 may be coupled to the first controlled electrode of the first pull-up transistor 1220.

The pull-up sub-circuit in the second set may include a second pull-up transistor 1224. The pull-down sub-circuit in the second set may include a second pull-down transistor 1222. The pull-up sub-circuit in the second set may further include a current limiter sub-circuit 1228 having a first end and a second end. In other words, the second set of sequentially coupled pull-up and pull-down sub-circuits may include the second pull-up transistor 1224, the second pull-down transistor 1222 and the current limiter sub-circuit 1228. The second pull-up transistor 1224 may include a control electrode, a first controlled electrode and a second controlled electrode. The second pull-down transistor 1222 may include a control electrode, a first controlled electrode and a second controlled electrode. The first controlled electrode of the second pull-down transistor 1222 may be coupled to the first end of the current limiter sub-circuit 1228 and the first controlled electrode of the second pull-up transistor 1224 may be coupled to the second end of the current limiter sub-circuit 1228.

In various alternate embodiments, the second set of sequentially coupled pull-up and pull-down sub-circuits may include the second pull-up transistor 1224 and the second pull-down transistor 1222. The first controlled electrode of the second pull-down transistor 1222 may be coupled to the first controlled electrode of the second pull-up transistor 1224.

The current limiter sub-circuit 1228 may include a current limiter transistor. The current limiter transistor may have a control electrode, a first controlled electrode and a second controlled electrode. The first end of the current limiter sub-circuit may include the first controlled electrode of the current limiter transistor. Further, the second end of the current limiter sub-circuit may include the second controlled electrode of the current limiter transistor. The control electrode of the current limiter transistor may be coupled to the second input electrode 1210. The current limiter transistor may be a PMOS transistor.

In various embodiments, the second set of sequentially coupled pull-up and pull-down sub-circuits coupled to the first set of sequentially coupled pull-up and pull-down sub-circuits to form the current mirror may include the control electrode of the first pull-up transistor 1220 coupled to the control electrode of the second pull-up transistor 1224. The control electrode of the first pull-up transistor 1220 may be further coupled to the first controlled electrode of the first pull-up transistor 1218 to form the current mirror.

In other words, the current mirror may include the first set of sequentially coupled pull-up and pull-down sub-circuits and the second set of sequentially coupled pull-up and pull-down sub-circuits. The first set of sequentially coupled pull-up and pull-down sub-circuits may include at least a first pull-up transistor 1220 and a first pull-down transistor 1218. The second set of sequentially coupled pull-up and pull-down sub-circuits may include at least a second pull-up transistor 1224 and a second pull-down transistor 1222. The controlled electrode of the first pull-up transistor 1218 may be coupled to both the control electrode of the first pull-up transistor 1220 and the control electrode of the second pull-up transistor 1224 for forming the current mirror.

The current limiter sub-circuit 1228 may be configured to reduce current flowing through the second pull-up transistor 1224 when the output electrode 1206 is at the second output voltage.

In various embodiments, the first reference voltage 1204 may be at "low" state e.g. at ground. In various embodiments, the second reference voltage 1214 may be at "high" state e.g. at VDD. The second reference voltage 1214 may be at a voltage in the super-threshold region or at a voltage in the about-threshold or near-threshold region.

When a first input voltage having a second logic state (e.g. a "low" state) is applied to the first input electrode 1208 and a second input voltage having a first logic state (e.g. a "high" state) is applied to the second input electrode 1210, the first pull-down transistor 1218 may be switched off while the second pull-down transistor may be switched on 1222. The control electrode of the current limiter transistor may be coupled the second input electrode 1210. Further, the current limiter transistor may be configured to be switched off when the second input voltage 1210 is in the first logic state (e.g. "high" state). The current limiter transistor may start to switch off and the current flowing through the current limiter transistor between the first controlled electrode and the second controlled electrode of the current limiter transistor may decrease. The strength of the pull-up path may be decreased and the fall delay may be improved. When the second output voltage is generated at the output electrode 1206, the current limiter transistor may be fully turned off. The current limiter transistor may be fully deactivated (i.e. turned off) for reducing the standby leakage.

In various embodiments, the feedback circuit 1212 may include a feedback transistor. The feedback transistor may include a control electrode, a first controlled electrode and a second controlled electrode.

The first controlled electrode of the feedback transistor may be coupled to the level shifting stage. The second controlled electrode of the feedback transistor may be further coupled to the second reference voltage 1214. The control electrode of the feedback transistor may be coupled to the output electrode 1206.

When a first input voltage having a first logic state (e.g. a "high" state) is applied to the first input electrode 1208 and a second input voltage having a second logic state (e.g. a "low" state) is applied to the second input electrode 1210, the first pull-down transistor 1218 may be activated (i.e. turned on). The first pull-up transistor 1220 and the second pull-up transistor 1224 may also be activated. The first output voltage (e.g. representing the first logic state e.g. the "high" state) may be generated at the output electrode 1206. The feedback transistor may be configured to be turned off or be deactivated when the control terminal of the feedback transistor is at the first logic state (e.g. the "high" state). The voltage at the control electrodes of both the first pull-up and the second pull-up transistors 1220, 1224 may remain at the second logic state (e.g. the "low" state) instead of being charged to the first logic state (substantially equal to the second reference voltage 1214). This allows the second pull-up transistor 1224 to remain fully on. The first output voltage may be maintained closer to the second reference voltage 1214 (compared to without the feedback transistor 1212). This may eliminate or reduce the leakage current in the subsequent buffering circuit.

When a first input voltage having a second logic state (e.g. a "low" state) is applied to the first input electrode 1208 and a second input voltage having a first logic state (e.g. a "high" state) is applied to the second input electrode 1210, the feedback transistor may be activated. The feedback transistor may be configured to be turned on or be activated when the control terminal of the feedback transistor is at the second logic state (e.g. a "low" state). Current may flow between the first controlled electrode and the second controlled electrode of the feedback transistor. The first and second pull-up transistors 1220, 1224 may be deactivated faster and the pull-up path may be weakened. The fall delay may be reduced.

In various embodiments, including the current limiter sub-circuit and the feedback circuit 1212 may reduce the standby leakage for both the first output voltage and the second output voltage with improved delay. Advantageously, the circuit arrangement according to various embodiments may have improved energy efficiency and/or small area. In various embodiments, the circuit arrangement may include twelve transistors (including output buffer which is not shown). The circuit arrangement according to various embodiments may possess benefis in terfacing bus signals.

In various embodiments, the pull-down transistors 1218, 1222 may be n-channel metal oxide semiconductor field effect transistors (MOSFETs). In various embodiments, the pull-up transistors 1220, 1224 may be p-channel metal oxide semiconductor field effect transistors (MOSFETs).

In various embodiments, the first reference voltage may be at ground. In various embodiments, the inverter 1226 may be powered by a third reference voltage (VDDL). In various embodiments, the third reference voltage may be lower than the second reference voltage (VDD). For instance, the third reference voltage may be at about 0.35V. The second reference voltage may be at about 1.2V.

Figure 13:
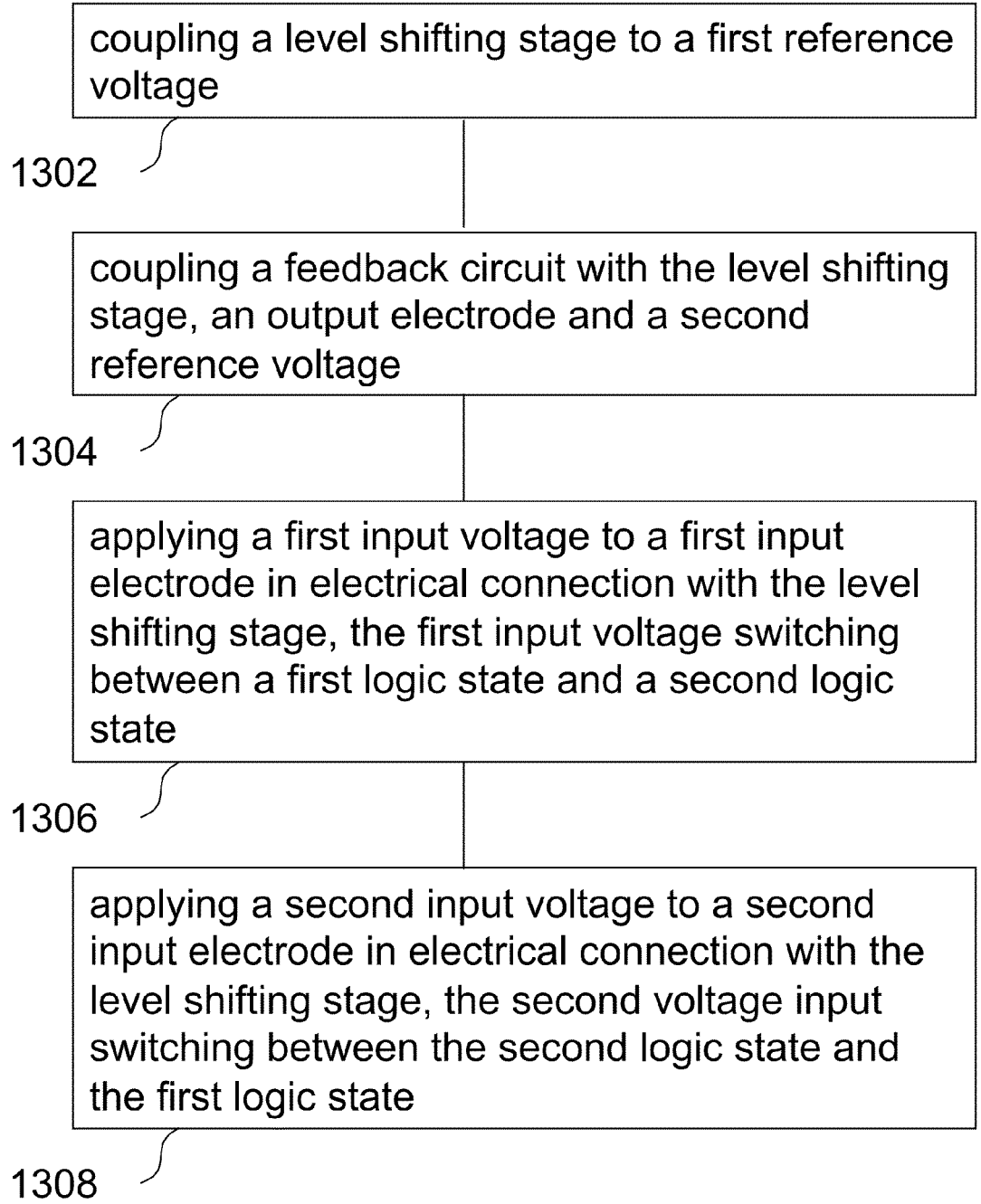
FIG. 13 shows a schematic of a method of operating a circuit arrangement according to various embodiments.

FIG. 13 shows a schematic 1300 of a method of operating a circuit arrangement according to various embodiments. The method includes, in 1302, coupling a level shifting stage to a first reference voltage. The method may also include, in 1304, coupling a feedback circuit with the level shifting stage, an output electrode and a second reference voltage. The output electrode may be in electrical connection with the level shifting stage. The method may further include, in 1306, applying a first input voltage to a first input electrode in electrical connection with the level shifting stage, the first input voltage switching between a first logic state and a second logic state. The method may additionally include, in 1308, applying a second input voltage to a second input electrode in electrical connection with the level shifting stage, the second voltage input switching between the second logic state and the first logic state. The level shifting stage may be configured to generate a first output voltage at the output electrode when the first input voltage is in the first logic state and the second input voltage is in the second logic state. The level shifting stage may also be configured to generate a second output voltage at the output electrode when the first input voltage is in the second logic state and the first input voltage is in the first logic state. The feedback circuit may further be configured to maintain the first output voltage at the output electrode above a predetermined level when the first input voltage is in the first logic state and the second input voltage is in the second logic state.

In various embodiments, the logic state of the second input voltage may different from the logic state of the first input voltage. The logic state of the second input voltage may different from the logic state of the first input voltage at steady state. In other words, the logic state of the second input voltage may different from the logic state of the first input voltage out of transitions or between transitions.

In various embodiments, a transition may refer to a period of time in which the first input voltage switches from a first logic state to a second logic state and the second input voltage switches from the second logic state to the first logic state. A transition may also refer to a period of time in which the second input voltage switches from a first logic state to a second logic state and the first input voltage switches from the second logic state to the first logic state.

The method may include applying the first input voltage at the first logic state to the first input electrode when applying the second input voltage at the second logic state to the second input electrode. The method may additionally or alternatively include applying the first input voltage at the second logic state to the first input electrode when applying the second input voltage at the first logic state to the second electrode.

The method may further include coupling an input inverter to the level shifting stage. The input inverter may include a first electrode and a second electrode. The first electrode may be coupled to the first input electrode and the second electrode may be coupled to the second input electrode.

In various embodiments, the first output voltage may represent the first logic state and the second output voltage may represent the second logic state.

In various embodiments, the first output voltage may be different from the first input voltage (and/or second input voltage) in the first logic state. The first output voltage may also be different from the first input voltage (and/or second input voltage) in the second logic state. The first output voltage may be higher than the first input voltage in the first logic state and/or the second logic state. In other words, the first input voltage at both the first logic state and the second logic state may be below the first output voltage.

In various embodiments, the feedback circuit may be configured to maintain the first output voltage at the output electrode above a predetermined level includes the feedback circuit configured to maintain the first output voltage at a substantially constant level.

In various embodiments, the level shifting stage may include a current mirror.

In various embodiments, the current mirror may include a first set of sequentially coupled pull-up and pull-down sub-circuits. The current mirror may further include a second set of sequentially coupled pull-up and pull-down sub-circuits. The second set of sequentially coupled pull-up and pull-down sub-circuits may be coupled to the first set of sequentially coupled pull-up and pull-down sub-circuits to form the current mirror.

The pull-up sub-circuit in the first set may include a first pull-up transistor. The pull-down sub-circuit in the first set may include a first pull-down transistor. In other words, the first set of sequentially coupled pull-up and pull-down sub-circuits may include the first pull-up transistor and the first pull-down transistor. The first pull-up transistor may have a control electrode, a first controlled electrode and a second controlled electrode. The first pull-down transistor may have a control electrode, a first controlled electrode and a second controlled electrode. The first controlled electrode of the first pull-down transistor may be coupled to the first controlled electrode of the first pull-up transistor.

The pull-up sub-circuit in the second set may include a second pull-up transistor. The pull-down sub-circuit in the second set may include a second pull-down transistor. The pull-up sub-circuit in the second set may further include a current limiter sub-circuit having a first end and a second end. In other words, the second set of sequentially coupled pull-up and pull-down sub-circuits may include the second pull-up transistor, the second pull-down transistor and the current limiter sub-circuit. The second pull-up transistor may include a control electrode, a first controlled electrode and a second controlled electrode. The second pull-down transistor may include a control electrode, a first controlled electrode and a second controlled electrode. The first controlled electrode of the second pull-down transistor may be coupled to the first end of the current limiter sub-circuit and the first controlled electrode of the second pull-up transistor may be coupled to the second end of the current limiter sub-circuit.

In various alternate embodiments, the second set of sequentially coupled pull-up and pull-down sub-circuits may include the second pull-up transistor and the second pull-down transistor. The first controlled electrode of the second pull-down transistor may be coupled to the first controlled electrode of the second pull-up transistor.

The current limiter sub-circuit may include a current limiter transistor. The current limiter transistor may have a control electrode, a first controlled electrode and a second controlled electrode. The first end of the current limiter sub-circuit may include the first controlled electrode of the current limiter transistor. The second end of the current limiter sub-circuit may include the second controlled electrode of the current limiter transistor. The control electrode of the current limiter transistor may be coupled to the second input electrode. The current limiter transistor may be a PMOS transistor.

In various embodiments, the second set of sequentially coupled pull-up and pull-down sub-circuits coupled to the first set of sequentially coupled pull-up and pull-down sub-circuits to form the current mirror may include the control electrode of the first pull-up transistor coupled to the control electrode of the second pull-up transistor. The control electrode of the first pull-up transistor may be further coupled to the first controlled electrode of the first pull-up transistor to form the current mirror.

In various embodiments, the method may include coupling a first controlled electrode of the first pull-down transistor to the first controlled electrode of the first pull-up transistor. The method may further include coupling a first controlled electrode of the second pull-down transistor to the first end of the current limiter sub-circuit and coupling the first controlled electrode of the second pull-up transistor to the second end of the current limiter sub circuit. Alternatively, the method may include coupling a first controlled electrode of the first pull-down transistor to the first controlled electrode of the first pull-up transistor.

The current limiter sub-circuit may include a current limiter transistor. The method may further include coupling the control electrode of the current limiter transistor to the second input electrode.

The method may include coupling the control electrode of the first pull-up transistor to the first controlled electrode of the first pull-up transistor for forming the current mirror. The method may also include coupling the control electrode of the pull-up transistor to the control electrode of the second pull-up transistor.

The method may further include configuring the current limiter sub-circuit to reduce current flowing through the second pull-up transistor when the output electrode is at the second output voltage.

In various embodiments, the feedback circuit may include a feedback transistor. The feedback transistor may include a control electrode, a first controlled electrode and a second controlled electrode.

The first controlled electrode of the feedback transistor may be coupled to the level shifting stage. The second controlled electrode of the feedback transistor may be further coupled to the second reference voltage. The control electrode of the feedback transistor may be coupled to the output electrode.

The method may include coupling the first controlled electrode of the feedback transistor to the level shifting stage. The method may further include coupling the second controlled electrode of the feedback transistor to the second reference voltage. The method may additionally include coupling the control electrode of the feedback transistor to the output electrode.

In various embodiments, the pull-down transistors may be n-channel metal oxide semiconductor field effect transistors (MOSFETs). In various embodiments, the pull-up transistors may be p-channel metal oxide semiconductor field effect transistors (MOSFETs).

In various embodiments, the first reference voltage may be at ground.

Figure 14A:
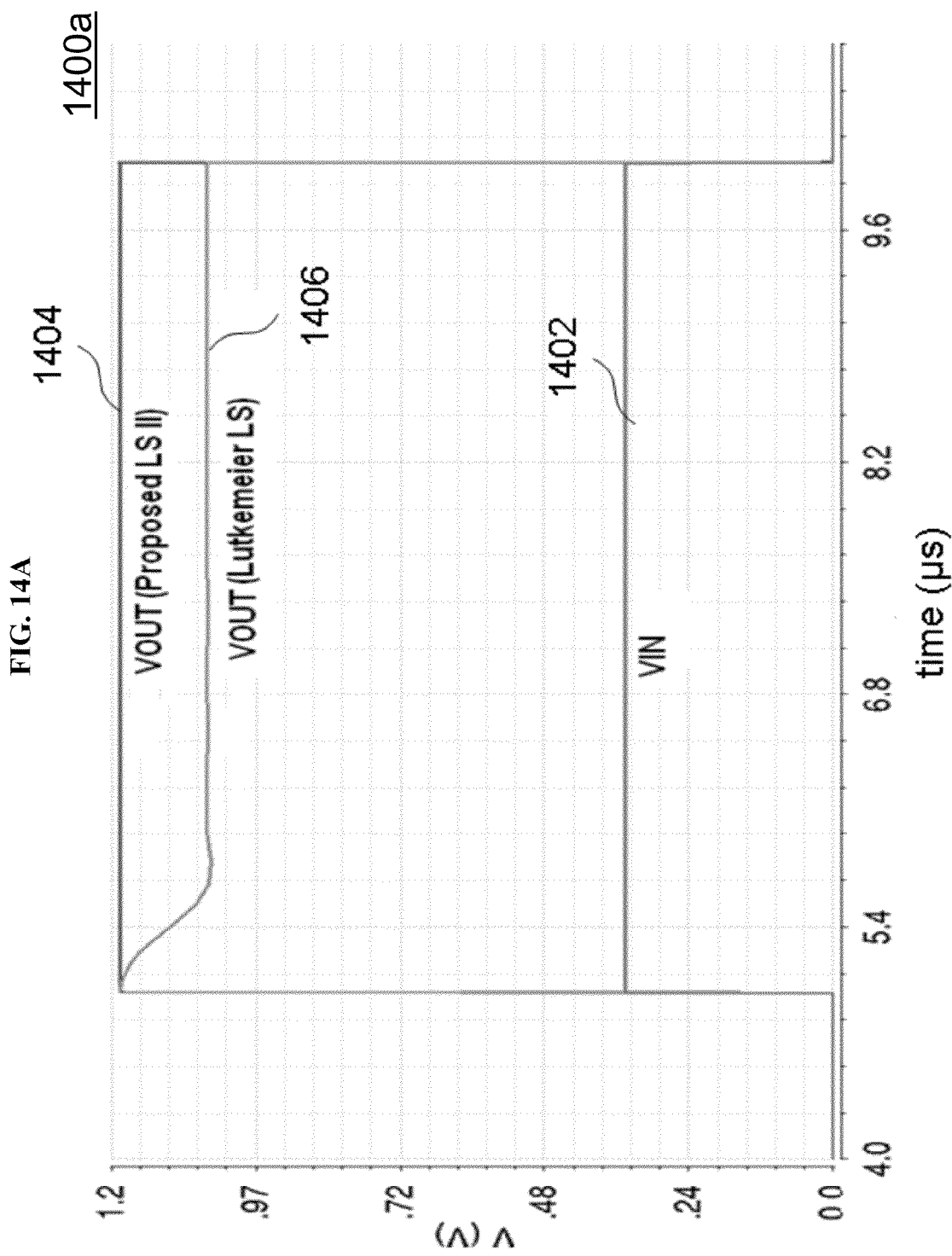
FIG. 14A is a graph of voltage as a function of time showing the transient behaviour of the first input voltage at a first input electrode and the output voltage at the output electrode of the circuit arrangement according to various embodiments as well as the output voltage of a conventional level shifter.

FIG. 14A is a graph 1400a of voltage as a function of time showing the transient behaviour of the first input voltage at a first input electrode and the output voltage at the output electrode of the circuit arrangement according to various embodiments as well as the output voltage of a conventional level shifter.

The graph is simulated using a 65 nm CMOS process technology and the threshold voltage is set at 0.4V. The input rise and fall transient time are set at 3 ns which is equal to the fan out of 4 (FO4) delay at 0.35 V. The output load capacitance is set to 100 fF. The third reference voltage (VDDL) is set at 0.35 V and the second reference voltage (VDD) is set at 1.2 V. Line 1402 indicates the first input voltage at the first input electrode. Line 1404 indicates the output voltage at the output electrode. The output voltage may include the first output voltage (about 1.2 V) and the second output voltage. Line 1404 indicates the output voltage of the conventional level shifter. As shown in FIG. 14A, the first output voltage generated by the circuit arrangement according to various embodiments may be substantially equal to the second reference voltage while the out put voltage of the conventional level shifter is able to reach only around 1 V. The full output voltage swing may largely reduce the standby leakage power in the subsequent buffering circuit.

Figure 14B:
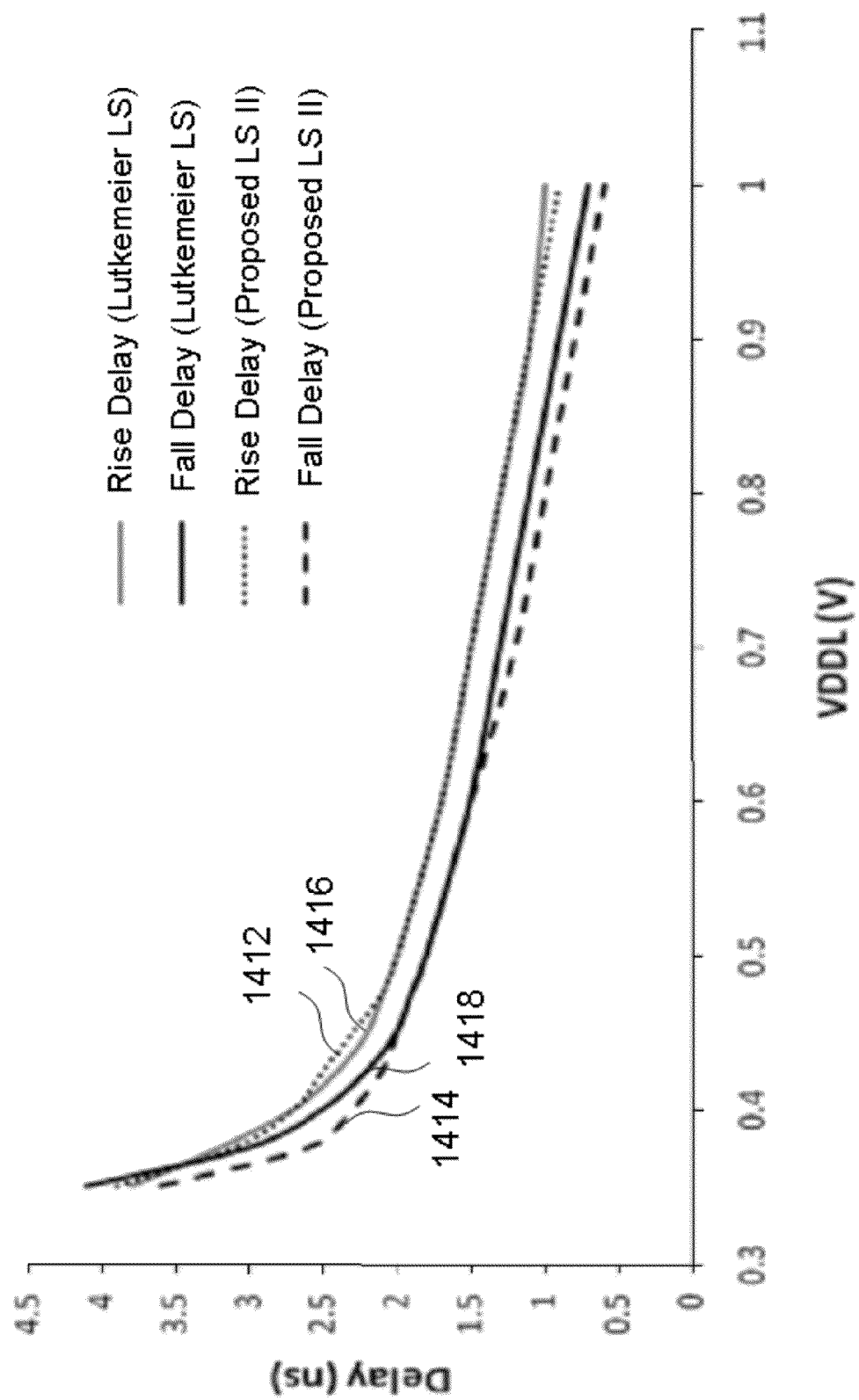
FIG. 14B is a graph of delay against the third reference voltage (VDDL)

FIG. 14B is a graph 1400b of delay against the third reference voltage (VDDL). Lines 1412 and 1414 indicate the rise delay and fall delay respectively for the circuit arrangement according to various embodiments. On the other hand, lines 1416 and 1418 indicate the rise delay and fall delay respectively for the conventional level shifter. The circuit arrangement according to various embodiments is slightly slower than the conventional level shifter at 0.35 V with an average of around 3.8 ns, but is still faster than the conventional level shifter at most other voltage levels.

Figure 15A:
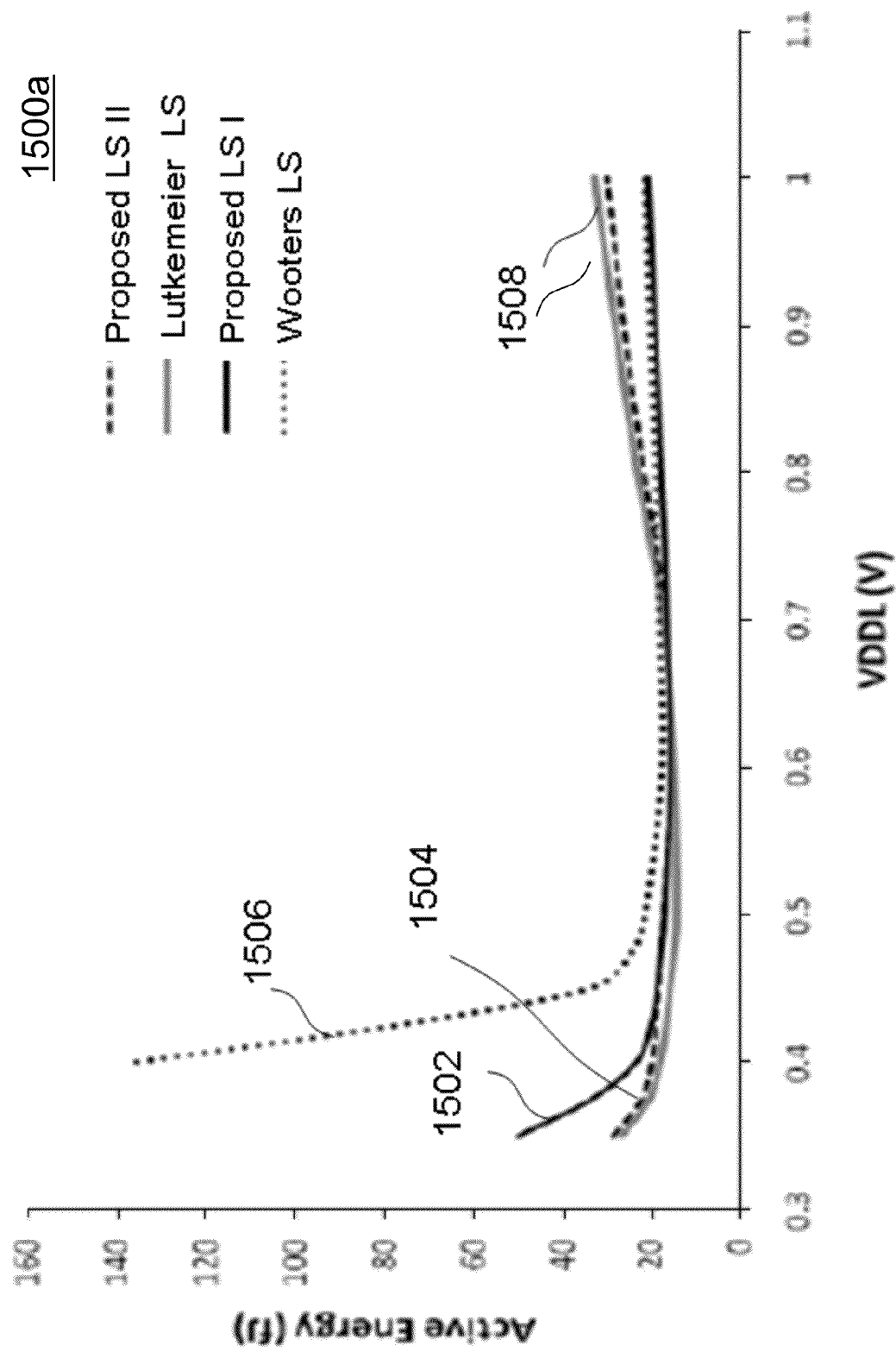
FIG. 15A is a graph of active energy per transition as a function of the third reference voltage (VDDL)

FIG. 15A is a graph 1500a of active energy per transition as a function of the third reference voltage (VDDL). Lines 1502 and 1504 indicate the active energy per transition of two circuit arrangements according to various embodiments. Lines 1506 and 1508 indicate the active energy per transition of two conventional level shifters. As VDDL increases in the around-threshold region, active energy decreases. This may be because the large delays in the around-threshold region cause significant short currents in the high voltage portion of the level shifters which dominate the active energy consumption. As VDDL increases toward the super-threshold region, the active energy may increase due to reduced short current (due to reduced delay) in the high voltage region and increased energy (due to increased voltage) in the low voltage region. Lines 1504 and 1508 are similar and on average, have the smallest active energies across all VDDLs. Line 1502 has slightly higher active energy compared to lines 1504 and 1508 but is still lower than line 1506, which may be due to significantly reduced delay especially in the around-threshold region.

Figure 15B:
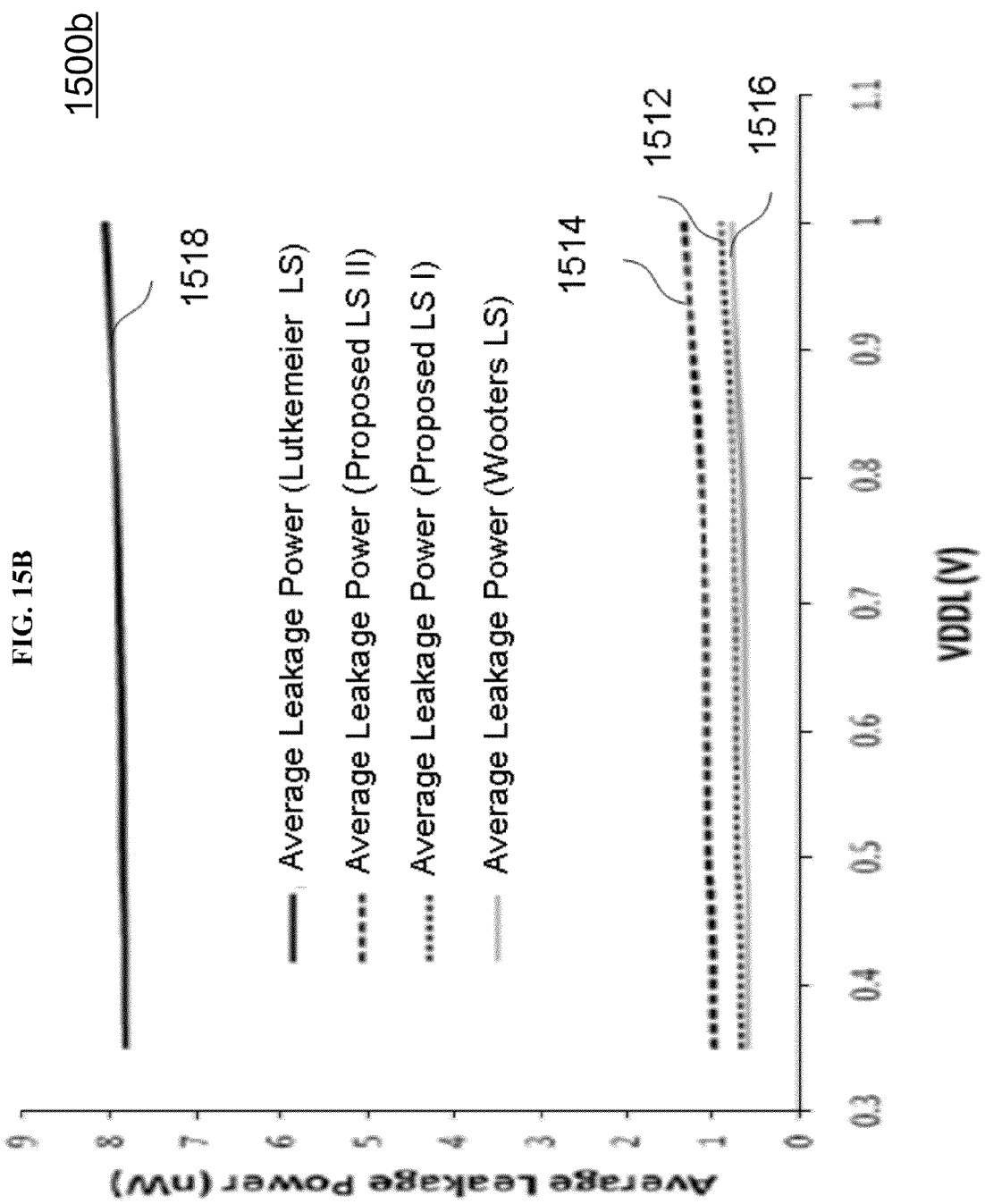
FIG. 15B is a graph of delay against the third reference voltage (VDDL).

FIG. 15B is a graph 1500b of average standby leakage power as a function of the third reference voltage (VDDL). Lines 1512 and 1514 indicate the average standby leakage power of two circuit arrangements according to various embodiments. Lines 1516 and 1518 indicate the average standby leakage power of two conventional level shifters. The two circuit arrangements according to various embodiments have less leakage power than the level shifter indicated by line 1518.

In various embodiments, the circuit arrangements are significantly better in terms of performance than conventional level shifters in terms of performance (up to 12 times) and energy (up to 8 times) while consuming similar or less area. Various embodiments may be suitable in low power systems with multiple voltage domains scalable from around-threshold region to super-threshold region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

The invention claimed is:

1. A circuit arrangement comprising:
   a level shifting stage coupled to a first reference voltage;
   a first input electrode in electrical connection with the level shifting stage for coupling a first input voltage;
   a second input electrode in electrical connection with the level shifting stage for coupling a second input voltage;
   an output electrode in electrical connection with the level shifting stage for providing one of a first output voltage and a second output voltage; and
   a feedback circuit coupled with the level shifting stage, the output electrode and a second reference voltage;
   wherein the first input voltage is configured to switch between a first logic state and a second logic state and the second input voltage is configured to switch between the second logic state and the first logic state; and
   wherein the level shifting stage is configured to generate the first output voltage when the first input voltage is in the first logic state and the second input voltage is in the second logic state and the level shifting stage is configured to generate the second output voltage when the first input voltage is in the second logic state and the second input voltage is in the first logic state; and
   wherein the feedback circuit is configured to maintain the first output voltage at the output electrode above a predetermined level when the first input voltage is in the first logic state and the second input voltage is in the second logic state;
   wherein the level shifting stage comprises a current mirror, the current mirror comprising:
      a first set of sequentially coupled pull-up and pull-down sub-circuits; and
   a second set of sequentially coupled pull-up and pull-down sub-circuits, the second set of sequentially coupled pull-up and pull-down sub-circuits coupled to the first set of sequentially coupled pull-up and pull-down sub-circuits to form the current mirror,
   wherein the first set of sequentially coupled pull-up and pull-down sub-circuits comprises:
      a first pull-up transistor having a control electrode, a first controlled electrode and a second controlled electrode; and
      a first pull-down transistor having a control electrode, a first controlled electrode and a second controlled electrode;
      wherein the first controlled electrode of the first pull-down transistor is coupled to the first controlled electrode of the first pull-up transistor, and
      wherein the control electrode of the first pull-up transistor is further coupled to the first controlled electrode of the first pull-up transistor,
   wherein the second set of sequentially coupled pull-up and pull-down sub-circuits comprises:

a second pull-up transistor having a control electrode, a first controlled electrode and a second controlled electrode;

a second pull-down transistor having a control electrode, a first controlled electrode and a second controlled electrode; and a current limiter sub-circuit having a first end and a second end;

wherein the first controlled electrode of the second pull-down transistor is coupled to the first end of the current limiter sub-circuit and the first controlled electrode of the second pull-up transistor is coupled to the second end of the current limiter sub-circuit, wherein the feedback circuit is coupled directly to the second reference voltage, and wherein the feedback circuit is coupled in series with the first pull-up transistor and the first pull-down transistor.

2. The circuit arrangement according to claim 1, wherein the logic state of the second input voltage is different from the logic state of the first input voltage at steady state.

3. The circuit arrangement according to claim 2, further comprising an input inverter having a first electrode and a second electrode, the first electrode coupled to the first input electrode and the second electrode coupled to the second input electrode.

4. The circuit arrangement according to claim 1,
wherein the current limiter sub-circuit comprises a current limiter transistor, the current limiter transistor having a control electrode, a first controlled electrode and a second controlled electrode;
wherein the first end of the current limiter sub-circuit comprises the first controlled electrode of the current limiter transistor; and
wherein the second end of the current limiter sub-circuit comprises the second controlled electrode of the current limiter transistor.

5. The circuit arrangement according to claim 4, wherein the control electrode of the current limiter transistor is coupled to the second input electrode.

6. The circuit arrangement according to claim 1, wherein the second set of sequentially coupled pull-up and pull-down sub-circuits coupled to the first set of sequentially coupled pull-up and pull-down sub-circuits to form the current mirror comprises the control electrode of the first pull-up transistor coupled to the control electrode of the second pull-up transistor.

7. The circuit arrangement according to claim 6, wherein the control electrode of the first pull-up transistor is further coupled to the first controlled electrode of the first pull-up transistor to form the current mirror.

8. The circuit arrangement according to claim 1, wherein the current limiter sub-circuit is configured to reduce current flowing through the second pull-up transistor when the output electrode is at the second output voltage.

9. The circuit arrangement according to claim 1, wherein the feedback circuit comprises a feedback transistor, the feedback transistor comprising a control electrode, a first controlled electrode and a second controlled electrode.

10. The circuit arrangement according to claim 9,
wherein the first controlled electrode of the feedback transistor is coupled to the level shifting stage; and
wherein the second controlled electrode of the feedback transistor is coupled to the second reference voltage.

11. The circuit arrangement according to claim 9, wherein the control electrode of the feedback transistor is coupled to the output electrode.

12. The circuit arrangement according to claim 1, wherein the pull-down transistors are n-channel metal oxide semiconductor field effect transistors (MOSFETs).

13. The circuit arrangement according to claim 1, wherein the pull-up transistors are p-channel metal oxide semiconductor field effect transistors (MOSFETs).

14. The circuit arrangement according to claim 1, wherein the first reference voltage is at ground.

15. The circuit arrangement according to claim 1, wherein the first input voltage at both the first logic state and the second logic state is below the first output voltage.

16. A method of operating a circuit arrangement, the method comprising:
coupling a level shifting stage to a first reference voltage;
coupling a feedback circuit with the level shifting stage, an output electrode and a second reference voltage, the output electrode in electrical connection with the level shifting stage;
applying a first input voltage to a first input electrode in electrical connection with the level shifting stage, the first input voltage switching between a first logic state and a second logic state;
applying a second input voltage to a second input electrode in electrical connection with the level shifting stage, the second voltage input switching between the second logic state and the first logic state;
wherein the level shifting stage is configured to generate a first output voltage at the output electrode when the first input voltage is in the first logic state and the second input voltage is in the second logic state and the level shifting stage is configured to generate a second output voltage at the output electrode when the first input voltage is in the second logic state and the first input voltage is in the first logic state;
wherein the feedback circuit is configured to maintain the first output voltage at the output electrode above a predetermined level when the first input voltage is in the first logic state and the second input voltage is in the second logic state,
wherein the level shifting stage comprises a current mirror, the current mirror comprising:
a first set of sequentially coupled pull-up and pull-down sub-circuits; and
a second set of sequentially coupled pull-up and pull-down sub-circuits, the second set of sequentially coupled pull-up and pull-down sub-circuits coupled to the first set of sequentially coupled pull-up and pull-down sub-circuits to form the current mirror,
wherein the first set of sequentially coupled pull-up and pull-down sub-circuits comprises:
a first pull-up transistor having a control electrode, a first controlled electrode and a second controlled electrode; and
a first pull-down transistor having a control electrode, a first controlled electrode and a second controlled electrode;
wherein the first controlled electrode of the first pull-down transistor is coupled to the first controlled electrode of the first pull-up transistor, and
wherein the control electrode of the first pull-up transistor is further coupled to the first controlled electrode of the first pull-up transistor,
wherein the second set of sequentially coupled pull-up and pull-down sub-circuits comprises:
a second pull-up transistor having a control electrode, a first controlled electrode and a second controlled electrode;

a second pull-down transistor having a control electrode, a first controlled electrode and a second controlled electrode; and a current limiter sub-circuit having a first end and a second end;

wherein the first controlled electrode of the second pull-down transistor is coupled to the first end of the current limiter sub-circuit and the first controlled electrode of the second pull-up transistor is coupled to the second end of the current limiter sub-circuit, wherein the feedback circuit is coupled directly to the second reference voltage, and wherein the feedback circuit is coupled in series with the first pull-up transistor and the first pull-down transistor.

17. A circuit arrangement comprising:

a level shifting stage coupled to a first reference voltage;

a first input electrode in electrical connection with the level shifting stage for coupling a first input voltage;

a second input electrode in electrical connection with the level shifting stage for coupling a second input voltage;

an output electrode in electrical connection with the level shifting stage for providing one of a first output voltage and a second output voltage; and a feedback circuit coupled with the level shifting stage, the output electrode and a second reference voltage;

wherein the first input voltage is configured to switch between a first logic state and a second logic state and the second input voltage is configured to switch between the second logic state and the first logic state; and wherein the level shifting stage is configured to generate the first output voltage when the first input voltage is in the first logic state and the second input voltage is in the second logic state and the level shifting stage is configured to generate the second output voltage when the first input voltage is in the second logic state and the second input voltage is in the first logic state; and wherein the feedback circuit is configured to maintain the first output voltage at the output electrode above a predetermined level when the first input voltage is in the first logic state and the second input voltage is in the second logic state, wherein the level shifting stage comprises a current mirror, the current mirror comprising:

a first set of sequentially coupled pull-up and pull-down sub-circuits; and a second set of sequentially coupled pull-up and pull-down sub-circuits, the second set of sequentially coupled pull-up and pull-down sub-circuits coupled to the first set of sequentially coupled pull-up and pull-down sub-circuits to form the current mirror, wherein the first set of sequentially coupled pull-up and pull-down sub-circuits comprises:

a first pull-up transistor having a control electrode, a first controlled electrode and a second controlled electrode; and a first pull-down transistor having a control electrode, a first controlled electrode and a second controlled electrode;

wherein the first controlled electrode of the first pull-down transistor is coupled to the first controlled electrode of the first pull-up transistor;

wherein the second set of sequentially coupled pull-up and pull-down sub-circuits comprises:

a second pull-up transistor having a control electrode, a first controlled electrode and a second controlled electrode;

a second pull-down transistor having a control electrode, a first controlled electrode and a second controlled electrode; and a current limiter sub-circuit having a first end and a second end;

wherein the first controlled electrode of the second pull-down transistor is coupled to the first end of the current limiter sub-circuit and the first controlled electrode of the second pull-up transistor is coupled to the second end of the current limiter sub-circuit;

wherein the current limiter sub-circuit comprises a current limiter transistor, the current limiter transistor having a control electrode, a first controlled electrode and a second controlled electrode;

wherein the first end of the current limiter sub-circuit comprises the first controlled electrode of the current limiter transistor, and wherein the second end of the current limiter sub-circuit comprises the second controlled electrode of the current limiter transistor; and wherein the control electrode of the current limiter transistor is coupled to the second input electrode.

18. A circuit arrangement comprising:

a level shifting stage coupled to a first reference voltage;

a first input electrode in electrical connection with the level shifting stage for coupling a first input voltage;

a second input electrode in electrical connection with the level shifting stage for coupling a second input voltage;

an output electrode in electrical connection with the level shifting stage for providing one of a first output voltage and a second output voltage; and a feedback circuit coupled with the level shifting stage, the output electrode and a second reference voltage;

wherein the first input voltage is configured to switch between a first logic state and a second logic state and the second input voltage is configured to switch between the second logic state and the first logic state; and wherein the level shifting stage is configured to generate the first output voltage when the first input voltage is in the first logic state and the second input voltage is in the second logic state and the level shifting stage is configured to generate the second output voltage when the first input voltage is in the second logic state and the second input voltage is in the first logic state; and wherein the feedback circuit is configured to maintain the first output voltage at the output electrode above a predetermined level when the first input voltage is in the first logic state and the second input voltage is in the second logic state, wherein the level shifting stage comprises a current mirror, the current mirror comprising:

a first set of sequentially coupled pull-up and pull-down sub-circuits; and a second set of sequentially coupled pull-up and pull-down sub-circuits, the second set of sequentially coupled pull-up and pull-down sub-circuits coupled to the first set of sequentially coupled pull-up and pull-down sub-circuits to form the current mirror, wherein the first set of sequentially coupled pull-up and pull-down sub-circuits comprises:

a first pull-up transistor having a control electrode, a first controlled electrode and a second controlled electrode; and a first pull-down transistor having a control electrode, a first controlled electrode and a second controlled electrode;

wherein the first controlled electrode of the first pull-down transistor is coupled to the first controlled electrode of the first pull-up transistor;
wherein the second set of sequentially coupled pull-up and pull-down sub-circuits comprises:
a second pull-up transistor having a control electrode, a first controlled electrode and a second controlled electrode;
a second pull-down transistor having a control electrode, a first controlled electrode and a second controlled electrode; and
a current limiter sub-circuit having a first end and a second end;
wherein the first controlled electrode of the second pull-down transistor is coupled to the first end of the current limiter sub-circuit and the first controlled electrode of the second pull-up transistor is coupled to the second end of the current limiter sub-circuit;
wherein the control electrode of the first pull-up transistor is coupled to the control electrode of the second pull-up transistor, and
wherein the control electrode of the first pull-up transistor is further coupled to the first controlled electrode of the first pull-up transistor to form the current mirror.

* * * * *